(12) United States Patent
Tran et al.

(10) Patent No.: US 7,651,951 B2
(45) Date of Patent: *Jan. 26, 2010

(54) PITCH REDUCED PATTERNS RELATIVE TO PHOTOLITHOGRAPHY FEATURES

(75) Inventors: Luan Tran, Meridian, ID (US); William T. Rericha, Boise, ID (US); John Lee, Boise, ID (US); Ramakanth Alapati, Boise, ID (US); Sheron Honarkhah, Boise, ID (US); Shuang Meng, Boise, ID (US); Puneet Sharma, Boise, ID (US); Jingyi Bai, San Jose, CA (US); Zhiping Yin, Boise, ID (US); Paul Morgan, Kuna, ID (US); Mirzafer K. Abatchev, Boise, ID (US); Gurtej S. Sandhu, Boise, ID (US); D. Mark Durcan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 377 days.

This patent is subject to a terminal disclaimer.

(21) Appl. No.: 11/681,027
(22) Filed: Mar. 1, 2007

(65) Prior Publication Data
US 2007/0161251 A1    Jul. 12, 2007

Related U.S. Application Data

(62) Division of application No. 11/214,544, filed on Aug. 29, 2005, now Pat. No. 7,253,118.

(60) Provisional application No. 60/662,323, filed on Mar. 15, 2005.

(51) Int. Cl.
H01L 21/302 (2006.01)
H01L 21/461 (2006.01)
(52) U.S. Cl. .............................. 438/738; 257/E21.246
(58) Field of Classification Search ............... 438/239, 438/639, 736; 257/E21.246
See application file for complete search history.

(56) References Cited

U.S. PATENT DOCUMENTS 4,234,362 A    11/1980    Riseman
(Continued)

FOREIGN PATENT DOCUMENTS

DE    280851    7/1990
(Continued)

OTHER PUBLICATIONS

European Patent Office Examination Report of Dec. 15, 2008; Application No. 06 736 975.0 —1528; 6 pages.

*Primary Examiner*—W. David Coleman
(74) *Attorney, Agent, or Firm*—Knobbe, Martens, Olson & Bear LLP

(57) ABSTRACT

Differently-sized features of an integrated circuit are formed by etching a substrate using a mask which is formed by combining two separately formed patterns. Pitch multiplication is used to form the relatively small features of the first pattern and conventional photolithography used to form the relatively large features of the second pattern. Pitch multiplication is accomplished by patterning a photoresist and then etching that pattern into an amorphous carbon layer. Sidewall spacers are then formed on the sidewalls of the amorphous carbon. The amorphous carbon is removed, leaving behind the sidewall spacers, which define the first mask pattern. A bottom anti-reflective coating (BARC) is then deposited around the spacers to form a planar surface and a photoresist layer is formed over the BARC. The photoresist is next patterned by conventional photolithography to form the second pattern, which is then is transferred to the BARC. The combined pattern made out by the first pattern and the second pattern is transferred to an underlying amorphous silicon layer and the pattern is subjected to a carbon strip to remove BARC and photoresist material. The combined pattern is then transferred to the silicon oxide layer and then to an amorphous carbon mask layer. The combined mask pattern, having features of difference sizes, is then etched into the underlying substrate through the amorphous carbon hard mask layer.

28 Claims, 32 Drawing Sheets

U.S. PATENT DOCUMENTS

| | | | |
|---|---|---|---|
| 4,419,809 A | 12/1983 | Riseman et al. |
| 4,432,132 A | 2/1984 | Kinsbron et al. |
| 4,502,914 A | 3/1985 | Trumpp et al. |
| 4,508,579 A | 4/1985 | Goth et al. |
| 4,570,325 A | 2/1986 | Higuchi |
| 4,648,937 A | 3/1987 | Ogura et al. |
| 4,716,131 A | 12/1987 | Okazawa et al. |
| 4,776,922 A | 10/1988 | Bhattascharyya et al. |
| 4,838,991 A | 6/1989 | Cote et al. |
| 5,013,680 A | 5/1991 | Lowrey et al. |
| 5,047,117 A | 9/1991 | Roberts |
| 5,053,105 A | 10/1991 | Fox, III |
| 5,117,027 A | 5/1992 | Bernhardt et al. |
| 5,328,810 A | 7/1994 | Lowrey et al. |
| 5,330,879 A | 7/1994 | Dennison |
| 5,470,661 A | 11/1995 | Bailey et al. |
| 5,514,885 A | 5/1996 | Myrick |
| 5,670,794 A | 9/1997 | Manning |
| 5,753,546 A | 5/1998 | Koh et al. |
| 5,789,320 A | 8/1998 | Andricacos et al. |
| 5,795,830 A | 8/1998 | Cronin et al. |
| 5,830,332 A | 11/1998 | Babich et al. |
| 5,899,746 A | 5/1999 | Mukai |
| 5,998,256 A | 12/1999 | Juengling |
| 6,004,862 A | 12/1999 | Kim et al. |
| 6,010,946 A | 1/2000 | Hisamune et al. |
| 6,042,998 A | 3/2000 | Brueck et al. |
| 6,057,573 A | 5/2000 | Kirsch et al. |
| 6,063,688 A | 5/2000 | Doyle et al. |
| 6,071,789 A | 6/2000 | Yang et al. |
| 6,110,837 A | 8/2000 | Linliu et al. |
| 6,143,476 A | 11/2000 | Ye et al. |
| 6,211,044 B1 | 4/2001 | Xiang et al. |
| 6,288,454 B1 | 9/2001 | Allman et al. |
| 6,291,334 B1 | 9/2001 | Somekh |
| 6,297,554 B1 | 10/2001 | Lin |
| 6,335,257 B1 | 1/2002 | Tseng |
| 6,348,380 B1 | 2/2002 | Weimer et al. |
| 6,362,057 B1 | 3/2002 | Taylor, Jr. et al. |
| 6,383,907 B1 | 5/2002 | Hasegawa et al. |
| 6,395,613 B1 | 5/2002 | Juengling |
| 6,423,474 B1 | 7/2002 | Holscher |
| 6,455,372 B1 | 9/2002 | Weimer |
| 6,475,867 B1 | 11/2002 | Hui et al. |
| 6,514,884 B2 | 2/2003 | Maeda |
| 6,522,584 B1 | 2/2003 | Chen et al. |
| 6,534,243 B1 | 3/2003 | Templeton |
| 6,548,396 B2 | 4/2003 | Naik et al. |
| 6,559,017 B1 | 5/2003 | Brown et al. |
| 6,566,280 B1 | 5/2003 | Meagley et al. |
| 6,573,030 B1 | 6/2003 | Fairbairn et al. |
| 6,602,779 B1 | 8/2003 | Li et al. |
| 6,632,741 B1 | 10/2003 | Clevenger et al. |
| 6,638,441 B2 | 10/2003 | Chang et al. |
| 6,667,237 B1 | 12/2003 | Metzler |
| 6,673,684 B1 | 1/2004 | Huang et al. |
| 6,686,245 B1 | 2/2004 | Mathew et al. |
| 6,689,695 B1 | 2/2004 | Lui et al. |
| 6,706,571 B1 | 3/2004 | Yu et al. |
| 6,709,807 B2 | 3/2004 | Hallock et al. |
| 6,734,107 B2 | 5/2004 | Lai et al. |
| 6,744,094 B2 | 6/2004 | Forbes |
| 6,773,998 B1 | 8/2004 | Fisher et al. |
| 6,794,699 B2 | 9/2004 | Bissey et al. |
| 6,800,930 B2 | 10/2004 | Jackson et al. |
| 6,835,662 B1 | 12/2004 | Erhardt et al. |
| 6,867,116 B1 | 3/2005 | Chung |
| 6,875,703 B1 | 4/2005 | Furukawa et al. |
| 6,893,972 B2 | 5/2005 | Rottstegge et al. |
| 6,924,191 B2 | 8/2005 | Liu et al. |
| 6,962,867 B2 | 11/2005 | Jackson et al. |
| 7,015,124 B1 | 3/2006 | Fisher et al. |
| 7,074,668 B1 | 7/2006 | Park et al. |
| 7,084,076 B2 | 8/2006 | Park et al. |
| 7,115,525 B2 * | 10/2006 | Abatchev et al. ............ 438/725 |
| 7,183,205 B2 | 2/2007 | Hong |
| 7,183,597 B2 | 2/2007 | Doyle |
| 7,208,379 B2 | 4/2007 | Venugopal et al. |
| 7,253,118 B2 * | 8/2007 | Tran et al. .................... 438/717 |
| 7,288,445 B2 | 10/2007 | Bryant et al. |
| 7,291,560 B2 | 11/2007 | Parascandola et al. |
| 7,455,956 B2 * | 11/2008 | Sandhu et al. ............... 430/313 |
| 2001/0005631 A1 | 6/2001 | Kim et al. |
| 2002/0042198 A1 | 4/2002 | Bjarnason et al. |
| 2002/0045308 A1 | 4/2002 | Juengling |
| 2002/0063110 A1 | 5/2002 | Cantell et al. |
| 2002/0068243 A1 | 6/2002 | Hwang et al. |
| 2002/0127810 A1 | 9/2002 | Nakamura et al. |
| 2003/0006410 A1 | 1/2003 | Doyle |
| 2003/0044722 A1 | 3/2003 | Hsu et al. |
| 2003/0109102 A1 | 6/2003 | Kujirai et al. |
| 2003/0119307 A1 | 6/2003 | Bekiaris et al. |
| 2003/0127426 A1 | 7/2003 | Chang et al. |
| 2003/0157436 A1 | 8/2003 | Manger et al. |
| 2003/0207207 A1 | 11/2003 | Li |
| 2003/0207584 A1 | 11/2003 | Sivakumar et al. |
| 2003/0216050 A1 | 11/2003 | Golz et al. |
| 2003/0230234 A1 | 12/2003 | Nam et al. |
| 2004/0000534 A1 | 1/2004 | Lipinski |
| 2004/0017989 A1 | 1/2004 | So |
| 2004/0018738 A1 | 1/2004 | Liu |
| 2004/0023475 A1 | 2/2004 | Bonser et al. |
| 2004/0023502 A1 | 2/2004 | Tzou et al. |
| 2004/0041189 A1 | 3/2004 | Voshell et al. |
| 2004/0043623 A1 | 3/2004 | Liu et al. |
| 2004/0053475 A1 | 3/2004 | Sharma |
| 2004/0079988 A1 | 4/2004 | Harari |
| 2004/0106257 A1 | 6/2004 | Okamura et al. |
| 2004/0235255 A1 | 11/2004 | Tanaka |
| 2005/0074949 A1 | 4/2005 | Jung et al. |
| 2005/0112886 A1 | 5/2005 | Asakawa et al. |
| 2005/0142497 A1 | 6/2005 | Ryou |
| 2005/0153562 A1 | 7/2005 | Furukawa et al. |
| 2005/0164454 A1 | 7/2005 | Leslie |
| 2005/0167394 A1 | 8/2005 | Liu et al. |
| 2005/0186705 A1 | 8/2005 | Jackson et al. |
| 2005/0272259 A1 | 12/2005 | Hong |
| 2006/0003182 A1 | 1/2006 | Lane et al. |
| 2006/0024940 A1 | 2/2006 | Furukawa et al. |
| 2006/0024945 A1 | 2/2006 | Kim et al. |
| 2006/0046161 A1 | 3/2006 | Yin et al. |
| 2006/0046200 A1 | 3/2006 | Abatchev et al. |
| 2006/0046201 A1 | 3/2006 | Sandhu et al. |
| 2006/0046422 A1 | 3/2006 | Tran et al. |
| 2006/0046484 A1 | 3/2006 | Abatchev et al. |
| 2006/0083996 A1 | 4/2006 | Kim |
| 2006/0172540 A1 | 8/2006 | Marks et al. |
| 2006/0189150 A1 | 8/2006 | Jung |
| 2006/0211260 A1 | 9/2006 | Tran et al. |
| 2006/0216923 A1 | 9/2006 | Tran et al. |
| 2006/0231900 A1 | 10/2006 | Lee et al. |
| 2006/0234138 A1 | 10/2006 | Fehlhaber et al. |
| 2006/0263699 A1 | 11/2006 | Abatchev et al. |
| 2006/0267075 A1 | 11/2006 | Sandhu et al. |
| 2006/0273456 A1 | 12/2006 | Sant et al. |
| 2006/0281266 A1 | 12/2006 | Wells |
| 2007/0026672 A1 | 2/2007 | Tang et al. |
| 2007/0045712 A1 | 3/2007 | Haller et al. |
| 2007/0048674 A1 | 3/2007 | Wells |
| 2007/0049011 A1 | 3/2007 | Tran |
| 2007/0049030 A1 | 3/2007 | Sandhu et al. |
| 2007/0049032 A1 | 3/2007 | Abatchev et al. |
| 2007/0049035 A1 | 3/2007 | Tran |
| 2007/0049040 A1 | 3/2007 | Bai et al. |

| | | | |
|---|---|---|---|
| 2007/0050748 | A1 | 3/2007 | Juengling |
| 2007/0210449 | A1 | 9/2007 | Caspary et al. |
| 2007/0215960 | A1 | 9/2007 | Zhu et al. |
| 2007/0275309 | A1 | 11/2007 | Liu |
| 2008/0054350 | A1 | 3/2008 | Breitwisch et al. |

FOREIGN PATENT DOCUMENTS

| | | |
|---|---|---|
| DE | 42 36 609 A1 | 5/1994 |
| EP | 0227303 | 7/1987 |
| EP | 0491408 | 6/1992 |
| EP | 1357433 | 10/2003 |
| JP | 05343370 | 12/1993 |
| JP | H8-55908 | 2/1996 |
| JP | H8-55920 | 2/1996 |
| KR | 1999-0001440 | 1/1999 |
| KR | 1999-027887 | 4/1999 |
| WO | WO 94/15261 | 7/1994 |
| WO | WO 02/099864 A1 | 12/2002 |
| WO | WO 2004/001799 A2 | 12/2003 |
| WO | WO 2004/003977 A2 | 1/2004 |
| WO | WO 2005/010973 | 2/2005 |
| WO | WO 2005/034215 A1 | 4/2005 |
| WO | WO 2006/026699 | 3/2006 |

OTHER PUBLICATIONS

Bergeron, et al., "Resolution Enhancement Techniques for the 90nm Technology Node and Beyond," Future Fab International, Issue 15, Jul. 11, 2003, 4 pages.

Bhave et al., "Developer-soluble Gap fill materials for patterning metal trenches in Via-first Dual Damascene process," preprint of Proceedings of SPIE: Advances in Resist Technology and Processing XXI, vol. 5376, John L. Sturtevant, editor, 2004, 8 pages.

Chung et al., "Pattern multiplication method and the uniformity of nanoscale multiple lines*," J.Vac.Sci.Technol. B21(4), Jul./Aug. 2003, pp. 1491-1495.

Chung et al., "Nanoscale Multi-Line Patterning Using Sidewall Structure," Jpn., J. App.. Phys. vol. 41 (2002) Pt. 1, No. 6B, pp. 4410-4414.

Joubert et al., "Nanometer scale linewidth control during etching of polysilicon gates in high density plasmas," Microelectronic Engineering 69 (2003), pp. 350-357.

Oehrlein et al., "Pattern transfer into low dielectric materials by high-density plasma etching," Solid State Tech., May 2000, 8 pages.

"U.S. Appl. No. 11/543,515, filed Oct. 24, 2006, MICRON Ref. No. 2005-1173.00/US."

Ex Parte Cantell, unpublished decision of the Board of Patent Appeals and Interferences, Mar. 4, 2005.

Bruek, S.R.J., "Optical and interferometric lithography—Nanotechnology enablers," *Proceedings of the IEEE*, vol. 93, No. 10, Oct. 2005, pp. 1704-1721.

Sheats et al., "Microlithography: Science and Technology," *Marcel Dekkar, Inc.*, pp. 104-105 (1998).

U.S. Office Action issued Jun. 2, 2008 in U.S. Appl. No. 11/219,067, filed Sep. 1, 2005.

U.S. Office Action issued Jun. 5, 2008 in U.S. Appl. No. 11/514,117, filed Aug. 30, 2006.

U.S. Office Action issued Jul. 11, 2008 in U.S. Appl. No. 11/367,020, filed Mar. 2, 2006.

U.S. Office Action issued May 15, 2008 in U.S. Appl. No. 11/492,513, filed Jul. 24, 2006.

U.S. Office Action issued Jun. 3, 2008 in U.S. Appl. No. 11/492,323, filed Jul. 24, 2006.

Choi et al., "Sublithographic nanofabrication technology for nanocatalysts and DNA chips," *J. Vac. Sci. Technol.*, pp. 2951-2955 (Nov./Dec. 2003).

* cited by examiner

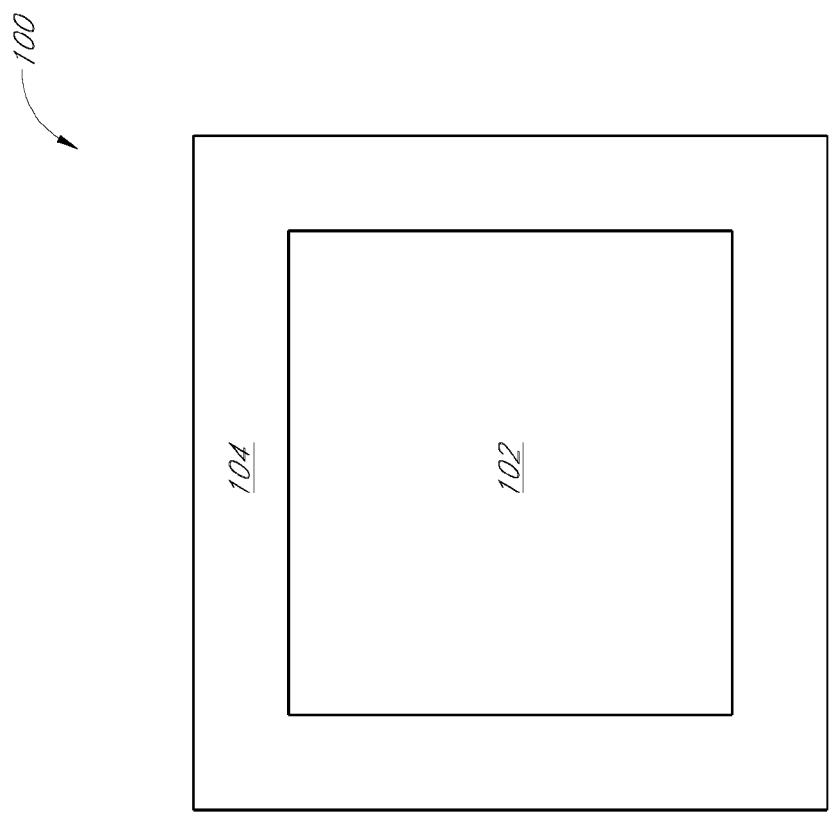

PITCH REDUCED PATTERNS RELATIVE TO PHOTOLITHOGRAPHY FEATURES

PRIORITY CLAIM

This application is a divisional of U.S. application Ser. No. 11/214,544, filed Aug. 29, 2005, now U.S. Pat. No. 7,253,118 which claims the priority benefit under 35 U.S.C. §119(e) of provisional Application No. 60/662,323, filed Mar. 15, 2005.

REFERENCE TO RELATED APPLICATIONS

This application is related to and incorporates the following by reference in their entireties: U.S. patent application Ser. No. 10/931,772 to Abatchev et al., filed Aug. 31, 2004; U.S. patent application Ser. No. 10/932,993 to Abatchev et al., filed Sep. 1, 2004; U.S. patent application Ser. No. 10/931,771 to Tran et al., filed Aug. 31, 2004; U.S. patent application Ser. No. 10/934,317 to Sandhu et al., filed Sep. 2, 2004.

BACKGROUND OF THE INVENTION

1. Field of the Invention

This invention relates generally to integrated circuit fabrication and, more particularly, to masking techniques.

2. Description of the Related Art

As a consequence of many factors, including demand for increased portability, computing power, memory capacity and energy efficiency, integrated circuits are continuously being reduced in size. The sizes of the constituent features that form the integrated circuits, e.g., electrical devices and interconnect lines, are also constantly being decreased to facilitate this size reduction.

The trend of decreasing feature size is evident, for example, in memory circuits or devices such as dynamic random access memories (DRAMs), flash memory, static random access memories (SRAMs), ferroelectric (FE) memories, etc. To take one example, DRAM typically comprises millions of identical circuit elements, known as memory cells. In its most general form, a memory cell typically consists of two electrical devices: a storage capacitor and an access field effect transistor. Each memory cell is an addressable location that can store one bit (binary digit) of data. A bit can be written to a cell through the transistor and can be read by sensing charge in the capacitor. By decreasing the sizes of the electrical devices that constitute a memory cell and the sizes of the conducting lines that access the memory cells, the memory devices can be made smaller. Additionally, storage capacities can be increased by fitting more memory cells on a given area in the memory devices.

The continual reduction in feature sizes places ever greater demands on the techniques used to form the features. For example, photolithography is commonly used to pattern features, such as conductive lines. The concept of pitch can be used to describe the sizes of these features. Pitch is defined as the distance between an identical point in two neighboring features. These features are typically defined by spaces between adjacent features, which spaces are typically filled by a material, such as an insulator. As a result, pitch can be viewed as the sum of the width of a feature and of the width of the space on one side of the feature separating that feature from a neighboring feature. However, due to factors such as optics and light or radiation wavelength, photolithography techniques each have a minimum pitch below which a particular photolithographic technique cannot reliably form features. Thus, the minimum pitch of a photolithographic technique is an obstacle to continued feature size reduction.

"Pitch doubling" or "pitch multiplication" is one proposed method for extending the capabilities of photolithographic techniques beyond their minimum pitch. A pitch multiplication method is illustrated in FIG. 1A-1F and described in U.S. Pat. No. 5,328,810, issued to Lowrey et al., the entire disclosure of which is incorporated herein by reference. With reference to FIG. 1A, a pattern of lines 10 is photolithographically formed in a photoresist layer, which overlies a layer 20 of an expendable material, which in turn overlies a substrate 30. As shown in FIG. 1B, the pattern is then transferred using an etch (preferably an anisotropic etch) to the layer 20, thereby forming placeholders, or mandrels, 40. The photoresist lines 10 can be stripped and the mandrels 40 can be isotropically etched to increase the distance between neighboring mandrels 40, as shown in FIG. 1C. A layer 50 of spacer material is subsequently deposited over the mandrels 40, as shown in FIG. 1D. Spacers 60, i.e., the material extending or originally formed extending from sidewalls of another material, are then formed on the sides of the mandrels 40. The spacer formation is accomplished by preferentially etching the spacer material from the horizontal surfaces 70 and 80 in a directional spacer etch, as shown in FIG. 1E. The remaining mandrels 40 are then removed, leaving behind only the spacers 60, which together act as a mask for patterning, as shown in FIG. 1F. Thus, where a given pitch previously included a pattern defining one feature and one space, the same width now includes two features and two spaces, with the spaces defined by, e.g., the spacers 60. As a result, the smallest feature size possible with a photolithographic technique is effectively decreased.

While the pitch is actually halved in the example above, this reduction in pitch is conventionally referred to as pitch "doubling," or, more generally, pitch "multiplication." Thus, conventionally, "multiplication" of pitch by a certain factor actually involves reducing the pitch by that factor. The conventional terminology is retained herein.

Because the layer 50 of spacer material typically has a single thickness 90 (see FIG. 1D and 1E) and because the sizes of the features formed by the spacers 60 usually correspond to that thickness 90, pitch doubling typically produces features of only one width. Circuits, however, generally employ features of different sizes. For example, random access memory circuits typically contain arrays of memory cells located in one part of the circuits and logic circuits located in the so-called "periphery." In the arrays, the memory cells are typically connected by conductive lines and, in the periphery, the conductive lines typically contact landing pads for connecting arrays to logic. Peripheral features such as landing pads, however, can be larger than the conductive lines. In addition, periphery electrical devices, including peripheral transistors, can be larger than the electrical devices in the array. Moreover, even if peripheral features can be formed with the same pitch as features in the array, because mask patterns formed by pitch multiplication may be limited to those that are formed along the sidewalls of patterned photoresist, pitch multiplication by itself typically does not offer the flexibility, e.g., geometric flexibility, required to define some features.

To overcome such limitations, some proposed methods for forming patterns at the periphery and in the array involve separately etching patterns into the array region and the periphery regions of a substrate. A pattern in the array is first formed and transferred to the substrate using one mask and then another pattern in the periphery is formed and separately transferred to the substrate using another mask. Because such methods form patterns using different masks at different locations on a substrate, they are limited in their ability to form features that require overlapping patterns, such as when a landing pad overlaps an interconnect line. As a result, yet a third mask may be necessary to "stitch" two separate patterns of features together. Undesirably, such a third mask would add to the expense and complexity of a process flow and would face technical challenges in aligning a mask with both the fine features defined by the pitch multiplication technique and the typically larger peripheral features.

Accordingly, there is a need for methods of forming features of different sizes, especially where some features are formed below the minimum pitch of a photolithographic technique, and especially in conjunction with pitch multiplication.

SUMMARY OF THE INVENTION

According to one aspect of the invention, a method is provided for forming an integrated circuit. The method comprises forming an amorphous carbon layer over a substrate. A lower hard mask layer is formed over the amorphous carbon layer. An upper hard mask layer is formed on the lower hard mask layer. A temporary layer is formed over the upper hard mask layer. A first hard mask layer is formed over the temporary layer.

According to another aspect of the invention, a method is provided for semiconductor processing. The method comprises providing a substrate having an overlying primary mask layer. A hard mask layer formed of a first material overlies the primary mask layer, a hard mask layer formed of a second material overlies the hard mask layer formed of the first material, and a pattern comprising pitch-multiplied spacers overlies the hard mask layer comprising the second material. The pattern is transferred to the hard mask layer comprising the second material. The pattern is subsequently transferred to the hard mask layer formed of the first material. The pattern is then transferred to the primary mask layer.

According to yet another aspect of the invention, a method is provided for semiconductor fabrication. The method comprises forming a first pattern by pitch multiplication and separately defining a second pattern using photolithography without pitch multiplication. The first and second patterns are simultaneously transferred to a hard mask layer. The first and second patterns are then simultaneously transferred from the hard mask layer to an other hard mask layer. The first and second patterns are simultaneously transferred from the other hard mask layer to a primary mask layer. The substrate is processed through the primary mask layer.

According to another aspect of the invention, a method is provided for forming a memory device. The method comprises forming a pattern comprising pitch multiplied spacers over a hard mask layer overlying an amorphous carbon layer. The pattern is etched into the hard mask layer. The spacers are subjected to a carbon etch after etching the pattern. The spacers are removed and the pattern is subsequently transferred from the hard mask layer to the amorphous carbon layer.

According to yet another aspect of the invention, a method is provided for integrated circuit fabrication. The method comprises forming an amorphous carbon layer over a substrate and depositing a hard mask layer on the amorphous carbon layer at a temperature less than about 450° C.

According to another aspect of the invention, a partially formed integrated circuit is provided. The partially formed integrated circuit comprises a substrate and a primary mask layer overlying the substrate. The primary mask layer is formed of a material different from photoresist. A lower hard mask layer overlies the primary mask layer and an upper hard mask layer overlies the lower mask layer. A mask material, which is different from photoresist, defines a first pattern in a first plane overlying the upper hard mask layer. A photodefinable material defines a second pattern over the upper hard mask layer.

BRIEF DESCRIPTION OF THE DRAWINGS

The invention will be better understood from the Detailed Description of the Preferred Embodiments and from the appended drawings, which are meant to illustrate and not to limit the invention, and wherein:

FIG. 2A is a schematic top plan view of a partially formed integrated circuit, in accordance with preferred embodiments of the invention;

DETAILED DESCRIPTION OF THE PREFERRED EMBODIMENTS

Figure 1A:
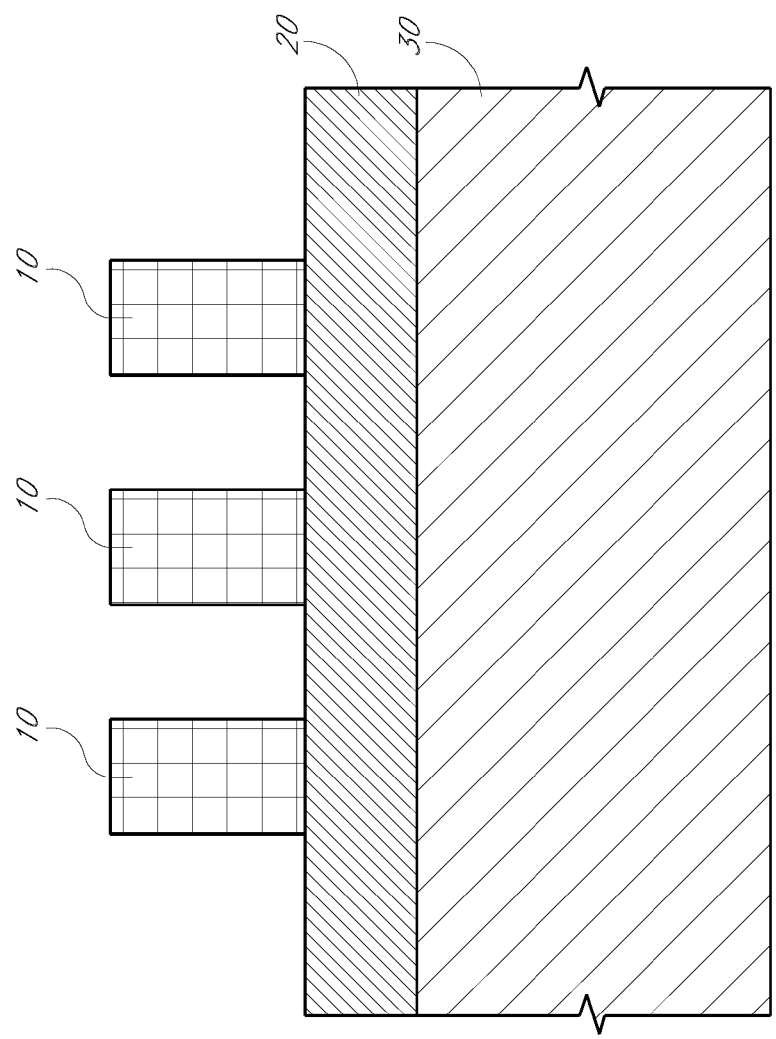
FIG. 1A-1F are schematic, cross-sectional side views of a sequence of masking patterns for forming conductive lines, in accordance with a prior art pitch doubling method.
Figure 1B:
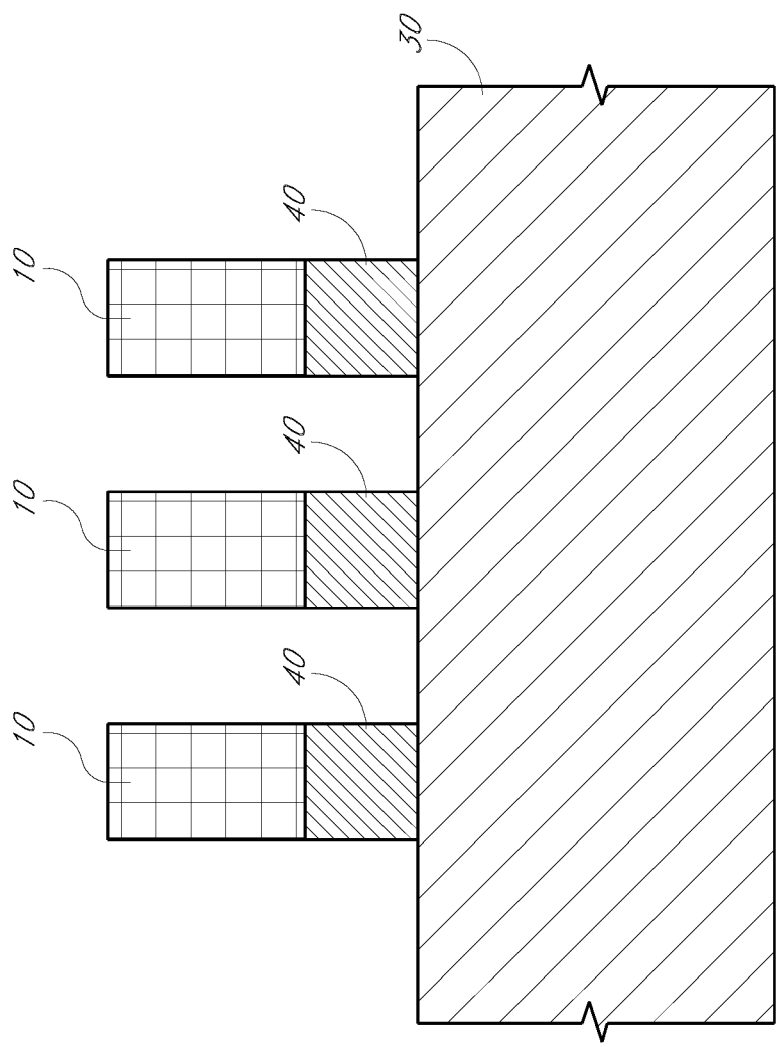
Figure 1C:
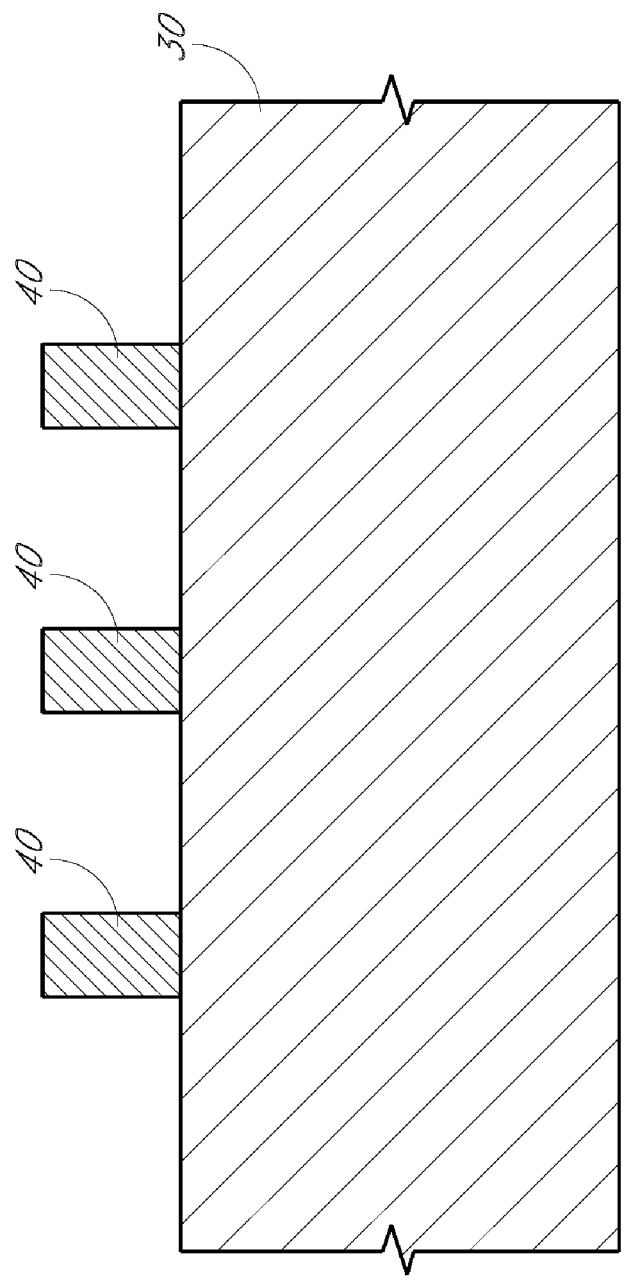
Figure 1D:
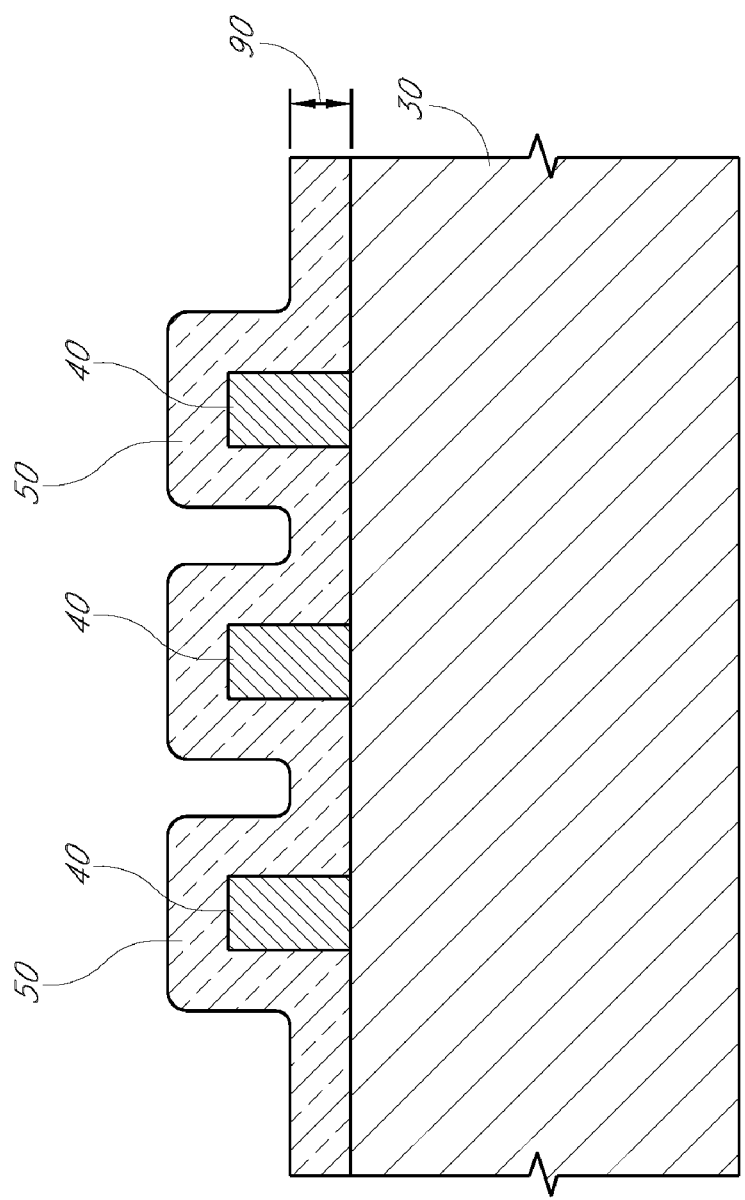
Figure 1E:
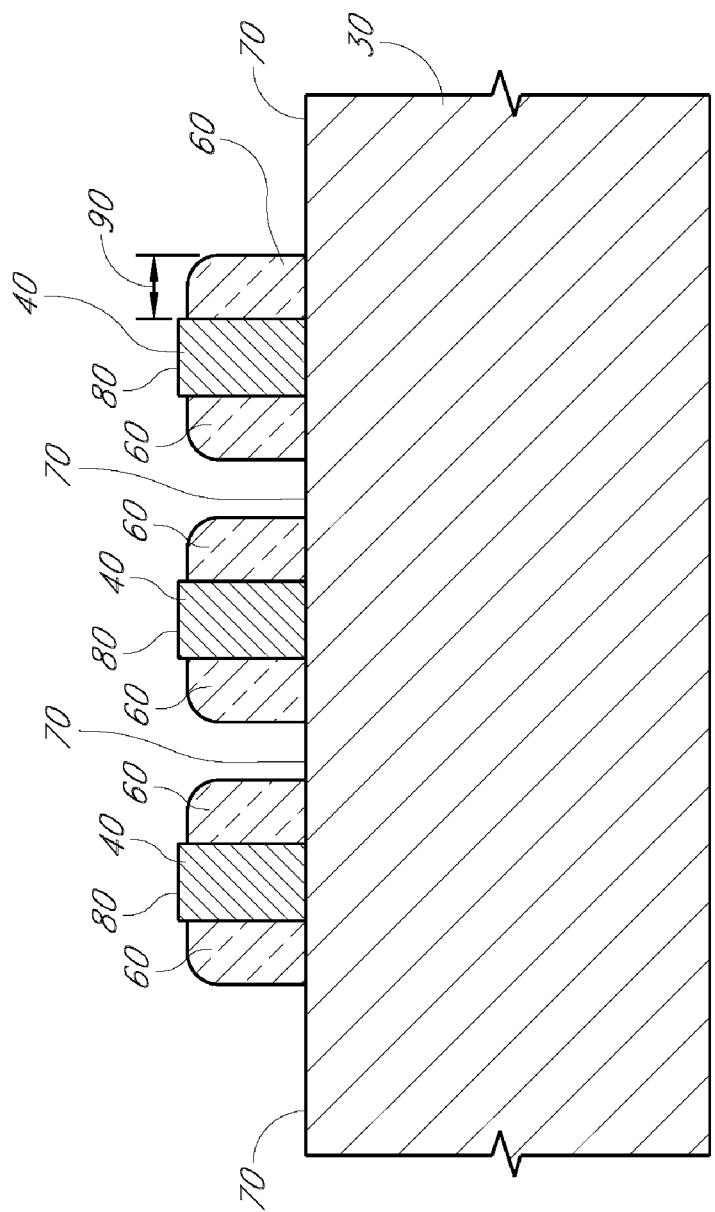
Figure 1F:
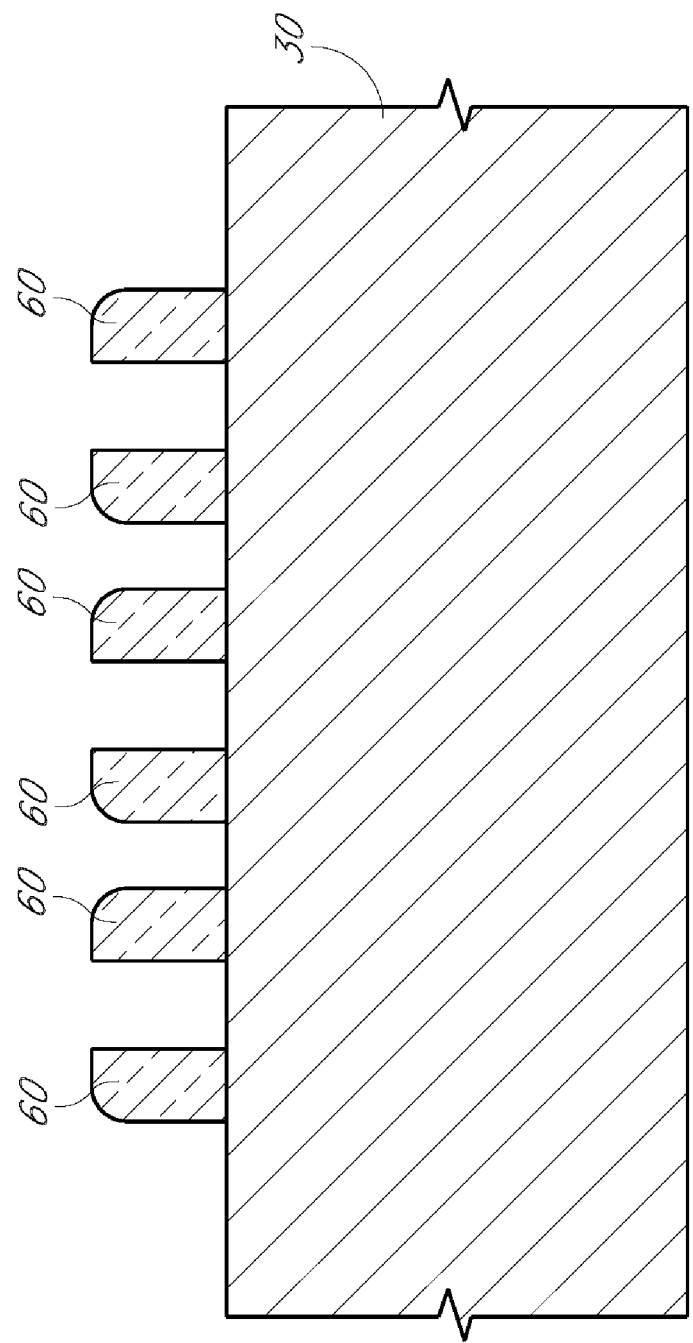

In addition to problems with forming differently sized features, it has been found that pitch doubling techniques can encounter difficulty in transferring spacer patterns to a substrate. In common methods of transferring patterns, both the spacers and the underlying substrate are exposed to an etchant, which preferentially etches away the substrate material. The etchants, however, can also wear away the spacers, albeit at a slower rate. Thus, over the course of transferring a pattern to an underlying material, the etchant can wear away the spacers before the pattern transfer is complete. These difficulties are exacerbated by the trend towards decreasing feature size, which, for example, increasingly leads to the need to form trenches which have increasingly higher depth to width ratios. Thus, in conjunction with difficulties in producing structures having different feature sizes, pattern transfer limitations make the application of pitch multiplication principles to integrated circuit manufacture even more difficult.

In view of these difficulties, preferred embodiments of the invention allow for improved pattern transfer and for the formation of differently sized features in conjunction with pitch multiplication. In a first phase of methods according to the preferred embodiments, an appropriate sequence of layers of materials is formed to allow formation of a mask for processing a substrate. In a second phase of methods according to the preferred embodiments, photolithography and pitch multiplication are preferably used to form a first pattern defined by spacers. This typically forms features of one size in one region of the chip, e.g., the array of a memory chip. In a third phase, photolithography is performed to form a second pattern in a mask layer formed over or around features forming the first pattern. To allow this photolithography, another photoresist layer can be formed around the spacers or, more preferably, the spacers are surrounded by a planarizing material and photoresist layer is preferably formed over the planarizing material. The second pattern can completely or partially overlap the first pattern, or, in some preferred embodiments, can be completely in a different region of the chip, e.g., the periphery of the memory chip.

In a fourth phase, both the first and second patterns are transferred to an underlying primary masking layer, which preferably can be preferentially etched relative to an underlying substrate. Because the primary masking layer is preferably used to transfer patterns the substrate, various precautions are preferably taken to maintain the structural and chemical integrity of this layer so that the patterns formed in this layer are well-defined.

As such, the pattern transfer is preferably accomplished by transferring the first and second patterns consecutively to two hard mask layers and then to the primary masking layer. It has been found that performing an etch through the planarizing layer or the photoresist layer can result in polymerization of the photoresist material and/or planarizing material. This polymerization can leave deposits around pattern features, thereby distorting features of the first and/or second patterns. This distortion can be particularly problematic given the small pitches for which pitch multiplication is typically used. As a result, after etching the first and second patterns into an upper hard mask layer, a cleaning step is preferably performed to remove the planarizing material, photoresist and any polymerized planarizing material or photoresist. Because the planarizing material, the photoresist and the underlying primary masking layer are preferably all carbon-based materials, the cleaning can also undesirably etch the primary masking layer. This is especially a concern where the cleaning is accomplished using an isotropic etch, which can etch the primary mask layer uncontrollably and typically does not form well-defined features. Thus, a lower hard mask layer is preferably used to protect the primary masking layer during the cleaning step.

Moreover, the lower hard mask layer and, more preferably, both the lower and upper hard mask are preferably formed by low temperature deposition processes, preferably performed at less than about 550° C. and, more preferably, at less than about 450° C. and, most preferably, at less than about 400° C. Processing at these low temperatures advantageously aids in maintaining the integrity of the primary masking layer, especially when that layer is formed of amorphous carbon. For example, undesirable ashing can occur if amorphous carbon is exposed to higher temperatures.

Thus, a preferred material for the primary masking layer is amorphous carbon. Preferred materials for the spacers include silicon, silicon nitride, or silicon oxide. In other embodiments, the materials for the spacers and the primary masking layer can be reversed. The upper hard mask layer is preferably formed of a material that can be deposited at low temperatures, as discussed above, and is preferentially etchable relative to the spacers, the lower hard mask layer and any material other material overlying the upper hard mask layer. The lower hard mask layer is preferably also formed of a material that can be deposited at low temperatures and is preferentially etchable relative to the primary masking layer and the upper hard mask layer. The spacers and the lower hard mask layer can be formed of different materials, but preferably are formed of the same material to simplify processing and process chemistries. For example, in some embodiments, the spacers and the lower hard mask layer can be formed of an oxide, e.g., silicon oxide, while the upper hard mask layer can be formed of, e.g., silicon, or vice versa. The first and second patterns can then be transferred from one or both hard mask layers to the primary masking layer.

The first and second patterns are then preferably transferred from the primary masking layer to the underlying substrate in a single step. Thus, patterns for forming differently sized features, some of which are below the minimum pitch of the photolithographic technique used for patterning, can be formed and these patterns can be successfully transferred to the underlying substrate. Moreover, because the second pattern is preferably initially formed in a layer substantially coextensive with the first pattern, the second pattern can overlap the first pattern. As a result, overlapping features of different sizes on both sides of the photolithographic limit, such as conducting lines and landing pads or periphery transistors, can advantageously be formed.

Preferably, the primary masking layer is the masking layer that directly overlies and, due to etch selectivity, is primarily used as the mask to pattern the substrate. In particular, the primary masking layer is preferably formed of a material that allows good etch selectivity relative to both the immediately overlying hard mask material and the substrate material, thereby allowing: the spacer pattern in the hard mask layer to be effectively transferred to it; the primary masking layer to be selectively removed without harming the substrate; and the pattern in it to be effectively transferred to the substrate. In other embodiments, particularly where the substrate is relatively simple and can be selectively etched relative to hard mask materials, the first and second patterns can be transferred directly to the substrate using a hard mask, e.g., the lower hard mask discussed above.

As noted above, in common methods of transferring patterns, both the mask and the underlying substrate are exposed to etchant, which can wear away a mask before the pattern transfer is complete. These difficulties are exacerbated where the substrate comprises multiple different materials to be etched. It is due to its excellent etch selectivity relative to a variety of materials, including oxides, nitrides and silicon, that the primary masking layer is preferably formed of amorphous carbon and, more preferably, transparent carbon.

While the primary mask layer is preferably appropriately thick so that it is not worn away before the pattern transfer is complete, it will be appreciated that the spacers and upper and lower hard mask layers typically also overlie the primary mask layer when etching a substrate. It has been found, however, that, in cases where the primary mask layer is particularly thick and/or the mask features are very thin, the relatively tall and thin features in the mask may not be structurally stable. As a result, the mask features can deform and may be unstable. Thus, an optional spacer or spacer and hard mask removal can be performed to straighten and stabilize the profile of the mask features before transfer of the pattern to the substrate. In other embodiments, one or both hard mask layers can be removed before transfer of the pattern to the substrate.

It will be appreciated that the "substrate" to which patterns are transferred can include a layer of a single material, a plurality of layers of different materials, a layer or layers having regions of different materials or structures in them, etc. These materials can include semiconductors, insulators, conductors, or combinations thereof. For example, the substrate can comprise doped polysilicon, an electrical device active area, a silicide, or a metal layer, such as a tungsten, aluminum or copper layer, or combinations thereof. In some embodiments, the mask features discussed below can directly correspond to the desired placement of conductive features, such as interconnects, in the substrate. In other embodiments, the substrate can be an insulator and the location of mask features can correspond to the desired location of insulators, such as in damascene metallization. Examples of structures formed in the substrate include gate stacks and shallow trench isolation structures.

In any of the steps described herein, transferring a pattern from an overlying level to an underlying level involves forming features in the underlying level that generally correspond to features in the overlying level. For example, the path of lines in the underlying level will generally follow the path of lines in the overlying level and the location of other features in the underlying level will correspond to the location of similar features in the overlying level. The precise shapes and sizes of features can vary from the overlying level to the underlying level, however. For example, depending upon etch chemistries and conditions, the sizes of and relative spacings between the features forming the transferred pattern can be enlarged or diminished relative to the pattern on the overlying level, while still resembling the same initial "pattern," as can be seen from the example of shrinking the first resist mask in the embodiments described below. Thus, even with some changes in the dimensions of features, the transferred pattern is still considered to be the same pattern as the initial pattern. In contrast, forming spacers around mask features can change the pattern.

Reference will now be made to the Figures, wherein like numerals refer to like parts throughout. It will be appreciated that these Figures are not necessarily drawn to scale.

In a first phase of methods according to the preferred embodiments, a sequence of layers of materials is formed that allow formation of a mask for processing a substrate.

FIG. 2A shows a top view of a portion of an integrated circuit 100. While the preferred embodiments can be used to form any integrated circuit, they are particularly advantageously applied to form devices having arrays of electrical devices, including memory cell arrays for volatile and non-volatile memory devices such as DRAM, ROM or flash memory, including NAND flash memory, or integrated circuits having logic or gate arrays. For example, the logic array can be a field programmable gate array (FPGA) having a core array similar to a memory array and a periphery with supporting logics. Consequently, the integrated circuit 100 can be, e.g., a memory chip or a processor, which can include both a logic array and embedded memory, or any other integrated circuit having a logic or a gate array.

With continued reference to FIG. 2A, a central region 102, the "array," is surrounded by a peripheral region 104, the "periphery." It will be appreciated that, in a fully formed integrated circuit 100, the array 102 will typically be densely populated with conducting lines and electrical devices such as transistors and capacitors. In a memory device, the electrical devices form a plurality of memory cells, which are typically arranged in a regular grid pattern at the intersection of word lines and bit lines. Desirably, pitch multiplication can be used to form features such as rows/columns of transistors and capacitors in the array 102, as discussed below. On the other hand, the periphery 104 typically comprises features larger than those in the array 102. Conventional photolithography, rather than pitch multiplication, is preferably used to pattern features, such as logic circuitry, in the periphery 104, because the geometric complexity of logic circuits located in the periphery 104 makes using pitch multiplication difficult, whereas the regular grid typical of array patterns is conducive to pitch multiplication. In addition, some devices in the periphery require larger geometries due to electrical constraints, thereby making pitch multiplication less advantageous than conventional photolithography for such devices. In addition to possible differences in relative scale, it will be appreciated by the skilled artisan that the relative positions, and the number of periphery 104 and array 102 regions in the integrated circuit 100 may vary from that depicted.

Figure 2B:
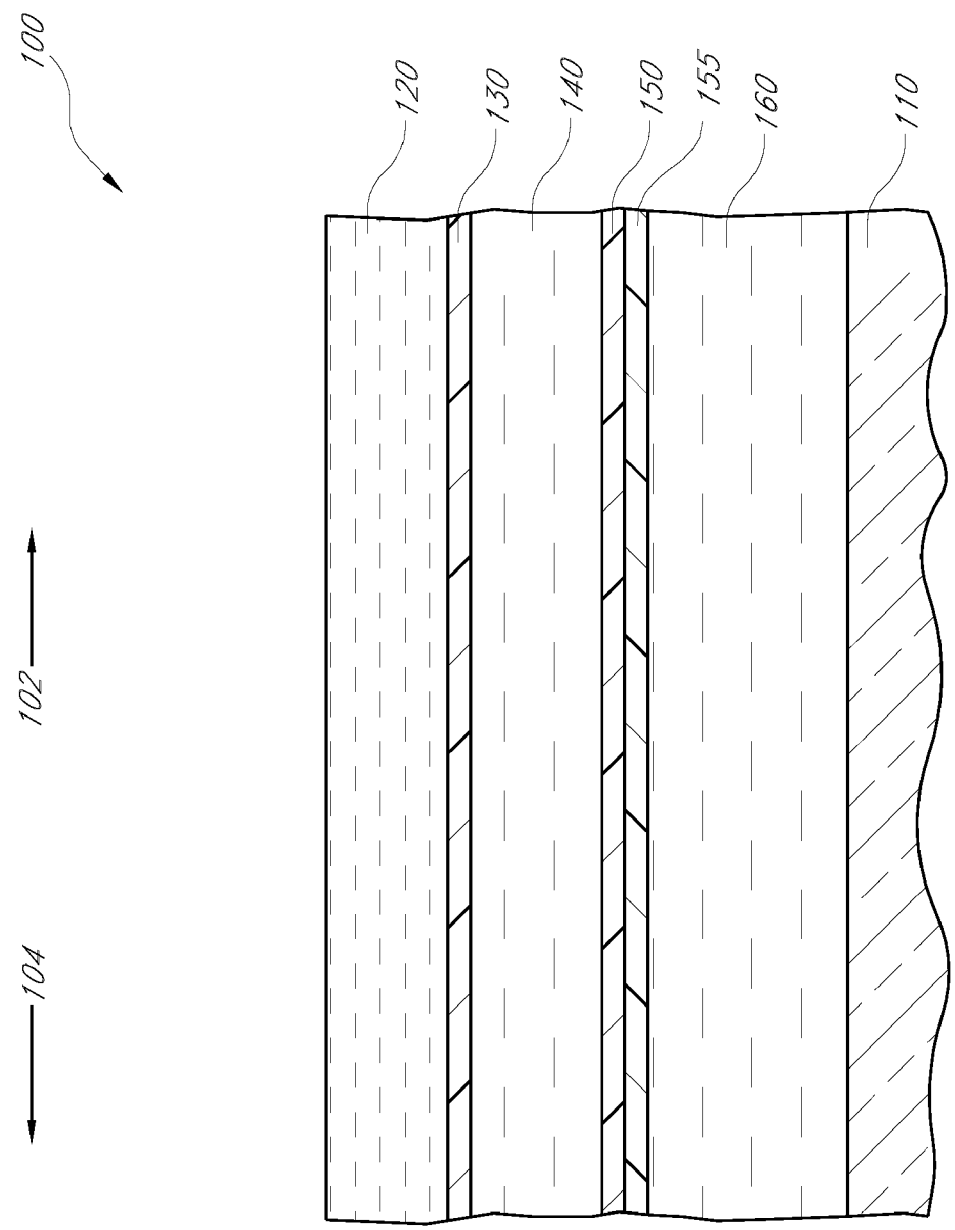
FIGS. 2B-2C are schematic cross-sectional side views of the partially formed integrated circuit of FIG. 2A, in accordance with preferred embodiments of the invention.

FIG. 2B shows a cross-sectional side view of the partially formed integrated circuit 100. Various masking layers 120-160 are preferably provided above a substrate 110. The layers 120-160 will be etched to form a mask for patterning the substrate 110, as discussed below.

The materials for the layers 120-160 overlying the substrate 110 are preferably chosen based upon consideration of the chemistry and process conditions for the various pattern forming and pattern transferring steps discussed herein. Because the layers between a topmost selectively definable layer 120 and the substrate 110 preferably function to transfer a pattern derived from the selectively definable layer 120 to the substrate 110, the layers 130-160 between the selectively definable layer 120 and the substrate 110 are preferably chosen so that they can be selectively etched relative to other exposed materials. It will be appreciated that a material is considered selectively, or preferentially, etched when the etch rate for that material is at least about 2-3 times greater, preferably at least about 10 times greater, more preferably at least about 20 times greater and, most preferably, at least about 40 times greater than that for surrounding materials. Because a goal of the layers 120-155 overlying the primary hard mask layer 160 is to allow well-defined patterns to be formed in that layer 160, it will be appreciated that one or more of the layers 120-155 can be omitted or substituted if suitable other materials, chemistries and/or process conditions are used. For example, the layer 130 can be omitted in some embodiments where the resolution enhancement properties of that layer, as discussed below, are not desired.

In the illustrated embodiment, the selectively definable layer 120 overlies a first hard mask, or etch stop, layer 130, which overlies a temporary layer 140, which overlies a second (upper) hard mask, or etch stop, layer 150, which overlies a third (lower) hard mask layer 155, which overlies a primary mask layer 160, which overlies the substrate 110 to be processed (e.g., etched) through a mask. Preferably, the mask through which the substrate 110 is processed is formed in the third hard mask layer 155 or in the primary mask layer 160.

With continued reference to FIG. 2B, the selectively definable layer 120 is preferably photodefinable, e.g., formed of a photoresist, including any photoresist known in the art. For example, the photoresist can be any photoresist compatible with 157 nm, 193 nm, 248 nm or 365 nm wavelength systems, 193 nm wavelength immersion systems, extreme ultraviolet systems (including 13.7 nm wavelength systems) or electron beam lithographic systems. In addition, maskless lithography, or maskless photolithography, can be used to define the selectively definable layer 120. Examples of preferred photoresist materials include argon fluoride (ArF) sensitive photoresist, i.e., photoresist suitable for use with an ArF light source, and krypton fluoride (KrF) sensitive photoresist, i.e., photoresist suitable for use with a KrF light source. ArF photoresists are preferably used with photolithography systems utilizing relatively short wavelength light, e.g., 193 nm. KrF photoresists are preferably used with longer wavelength photolithography systems, such as 248 nm systems. In other embodiments, the layer 120 and any subsequent resist layers can be formed of a resist that can be patterned by nano-imprint lithography, e.g., by using a mold or mechanical force to pattern the resist.

The material for the first hard mask layer 130 preferably comprises an inorganic material. Exemplary materials include silicon oxide ($SiO_2$), silicon or a dielectric anti-reflective coating (DARC), such as a silicon-rich silicon oxynitride. Preferably, the first hard mask layer 130 is a dielectric anti-reflective coating (DARC). Using DARCs for the first hard mask layer 130 can be particularly advantageous for forming patterns having pitches near the resolution limits of a photolithographic technique. The DARCs can enhance resolution by minimizing light reflections, thus increasing the precision with which photolithography can define the edges of a pattern.

The temporary layer 140 is preferably formed of amorphous carbon, which, as noted above, offers very high etch selectivity relative to the preferred hard mask materials. More preferably, the amorphous carbon is a form of amorphous carbon that is highly transparent to light and that offers further improvements for photo alignment by being transparent to the wavelengths of light used for such alignment. Deposition techniques for forming such transparent carbon can be found in A. Helmbold, D. Meissner, Thin Solid Films, 283 (1996) 196-203, the entire disclosure of which is incorporated herein by reference.

The combination of materials for the second and third hard mask layers 150 and 155 are preferably chosen based upon the material used for the spacers and for the underlying layer 160. As discussed below, the layer 160 is preferably formed of amorphous carbon. Exemplary combinations of the other materials are listed in the table below:

| | Exemplary Spacer and Hard Mask Materials | | | |
|---|---|---|---|---|
| | Spacer material: | | | |
| | Oxide | Nitride | Amorphous silicon | Carbon |
| Hard mask materials (Second hard mask/Third hard mask): | Amorphous silicon/oxide | Amorphous silicon/oxide or oxide/amorphous silicon | Oxide/amorphous silicon | Amorphous silicon/oxide or oxide/amorphous silicon |

It will be appreciated that the oxide is preferably a form of silicon oxide and the nitride is typically silicon nitride. Where the spacer material is carbon, the temporary layer is preferably a material that is preferentially etchable relative to the carbon. For example, the temporary layer can be formed of a silicon-containing material. Depending on the selection of appropriate etch chemistries and neighboring materials, examples of other hard mask materials include amorphous carbon and etchable high-K materials.

In the illustrated embodiment, the second hard mask layer 150 is formed of silicon, e.g., amorphous silicon. The third hard mask layer 155 is formed of a silicon oxide, e.g., a low silane oxide (LSO). The LSO is formed by chemical vapor deposition using a relatively low silane flow and a relatively high $N_2O$ precursor flow. Advantageously, such a deposition can be performed at relatively low temperatures, e.g., less than about 550° C. and, more preferably, less than about 400° C., to prevent damage to the underlying primary mask layer 160, when the layer 160 is formed of a temperature-sensitive material. It will be appreciated that oxides can typically be etched with greater selectivity relative to silicon than nitrides. For example, etch chemistries for oxides can remove the oxides at a rate more than 10 times faster than amorphous silicon, while etch chemistries for nitrides typically only remove the nitrides at a rate of about 3 times faster than amorphous silicon. As a result, both the spacers and the third hard mask layer are preferably formed of the same material, an oxide, when the second hard mask layer is formed of amorphous silicon.

As noted above, the primary mask layer 160 is preferably formed of amorphous carbon due to its excellent etch selectivity relative to many materials. As noted above, amorphous carbon is particularly advantageous for transferring patterns to difficult to etch substrates, such as a substrate 110 comprising multiple materials or multiple layers of materials, or for forming small and high aspect ratio features.

In addition to selecting appropriate materials for the various layers, the thicknesses of the layers 120-160 are preferably chosen depending upon compatibility with the etch chemistries and process conditions described herein. As discussed above, when transferring a pattern from an overlying layer to an underlying layer by selectively etching the underlying layer, materials from both layers are removed to some degree. Thus, the upper layer is preferably thick enough so that it is not worn away over the course of the pattern transfer.

In the illustrated embodiment, the photodefinable layer 120 is preferably about 50-300 nm thick and, more preferably, about 200-250 nm thick. It will be appreciated that, in cases where the layer 120 is a photoresist, this thickness can vary depending upon the wavelength of light used to pattern the layer 120. A thickness of about 50-300 nm thick and, more preferably, about 200-250 nm thick is particularly advantageous for 248 nm wavelength systems.

The first hard mask layer 130 is preferably about 10-40 nm thick and, more preferably, about 15-30 nm thick. The temporary layer 140 is preferably about 50-200 nm thick and, more preferably, about 80-120 nm thick. The second hard mask layer 150 is preferably about 20-80 nm thick and, more preferably, about 30-50 nm thick and the third hard mask layer 155 is preferably about 10-50 mn thick and, more preferably, about 20-30 nm thick.

As discussed above, the thickness of the primary mask layer 160 is preferably chosen based upon the selectivity of the etch chemistry for etching the substrate and based upon the materials and complexity of the substrate. Advantageously, it has been found that a thickness of preferably about 100-500 nm and, more preferably, about 200-300 nm is particularly effective for transferring patterns to a variety of substrates, including substrates having a plurality of different materials to be etched during the transfer.

Figure 2C:
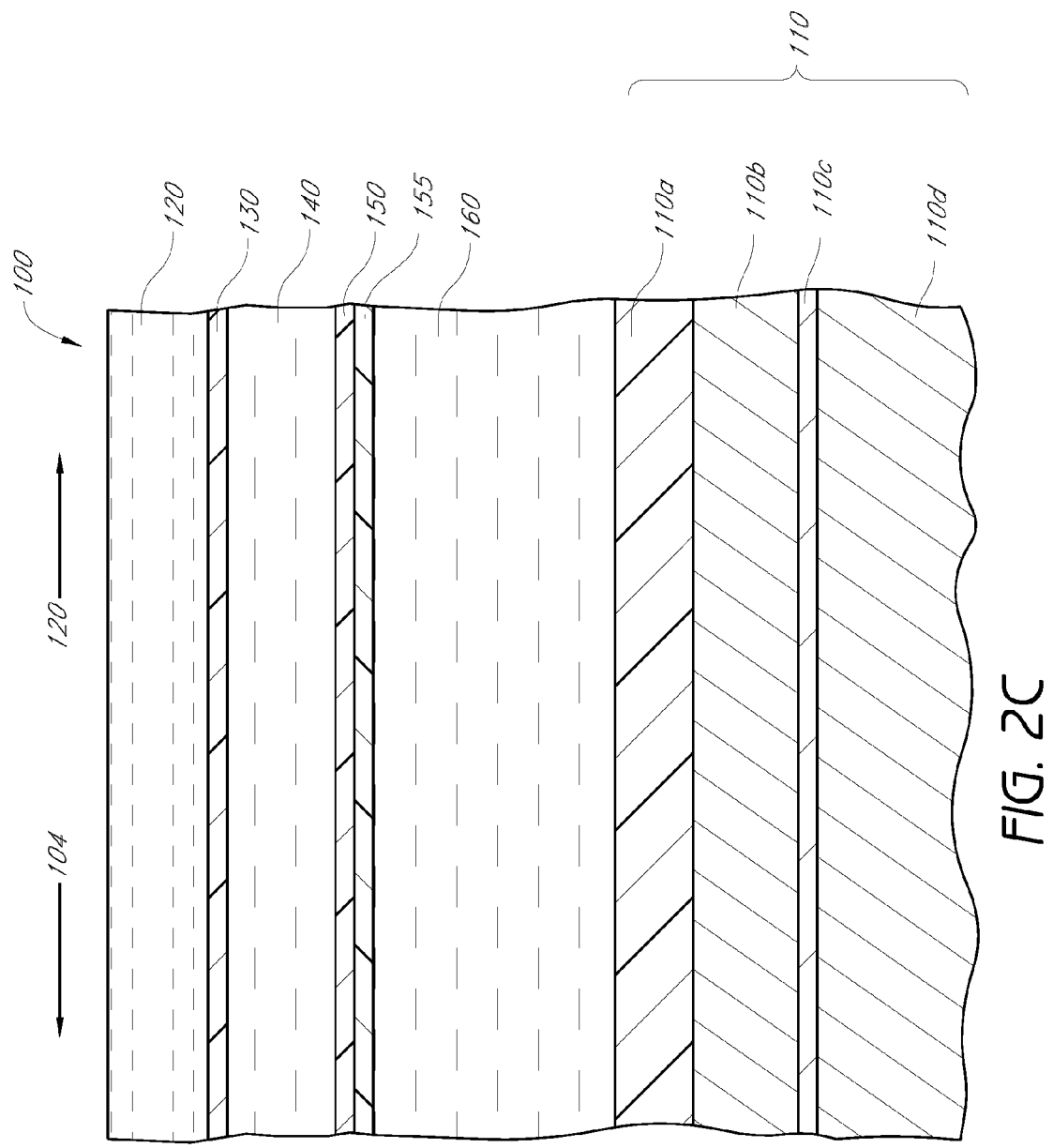

For example, FIG. 2C shows an exemplary substrate 160 comprising a plurality of layers which can be etched to form control gate stacks. A silicide layer 110a overlies a polysilicon layer 110b, which overlies an oxide-nitride-oxide (ONO) composite layer 110c, which overlies a polysilicon layer 110d.

The various layers discussed herein can be formed by various methods. For example, spin-on-coating processes can be used to form photodefinable layers. Various vapor deposition processes, such as chemical vapor deposition, can be used to form hard mask layers.

Preferably, a low temperature chemical vapor deposition (CVD) process is used to deposit the hard mask layers or any other materials, e.g., spacer material, over the primary mask layer 160, especially in cases where the primary mask layer 160 is formed of amorphous carbon.

Advantageously, it has been found that the second and third hard mask layers 150 and 155 can be deposited at temperatures of less than about 550° C. and, more preferably, less than about 450° C. and, most preferably, less than about 400° C. Such low temperature deposition processes advantageously prevent chemical or physical disruption of the amorphous carbon layer(s).

For example, a LSO, e.g., for forming either the layers 150 or 155, can be deposited by a plasma enhanced CVD (PECVD) process. Various processing systems made by various manufacturers can be used to perform the process, as known in the art. A non-limiting example of a suitable reactor system is the Applied Materials' Producer™ system. In one example of process conditions, $SiH_4$ is preferably flowed into the reactor at a rate of about 50-250 sccm and, more preferably, about 150 sccm. $N_2O$ is flowed into the reactor at a rate of about 400-1000 sccm and, more preferably, about 750 sccm, and He is flowed into the reactor at a rate of about 2500-4000 sccm and, more preferably, about 3500 sccm. The pressure within reactor is preferably maintained at about 4-8 torr and, more preferably, about 6.5 torr. The RF power is preferably about 50-200 watts and, more preferably, about 110 watts. The spacing is preferably about 400-600 mils and, more preferably, about 450 mils. Advantageously, it has been found that the LSO can be deposited at a temperature of about 250-450° C. and, more preferably, about 375° C.

It has been found that amorphous silicon, e.g., for forming the other of the layers 150 or 155 can also be deposited at low temperatures by a plasma enhanced CVD (PECVD) process. In one example, $SiH_4$ and He are delivered to the reactor in an Applied Materials' Producer™ system. The $SiH_4$ is preferably flowed at about 80-300 sccm and, more preferably, about 150 sccm. The He is flowed at about 400-300 sccm and, more preferably, about 1800 sccm. The pressure within the reactor is preferably about 3-5 torr and, more preferably, about 3.5 torr and the RF power is preferably about 50-200 watts and, more preferably, about 100 watts. The spacing is preferably about 400-600 mils and, more preferably, about 450 mils. Advantageously, the amorphous silicon can be deposited at a temperature of about 250-450° C., and, more preferably, about 375° C.

In addition, the amorphous carbon layers can be formed by chemical vapor deposition using a hydrocarbon compound, or mixtures of such compounds, as carbon precursors. Exemplary precursors include propylene, propyne, propane, butane, butylene, butadiene and acetelyne. A suitable method for forming amorphous carbon layers is described in U.S. Pat. No. 6,573,030 B1, issued to Fairbairn et al. on Jun. 3, 2003, the entire disclosure of which is incorporated herein by reference. In addition, the amorphous carbon may be doped. A suitable method for forming doped amorphous carbon is described in U.S. patent application Ser. No. 10/652,174 to Yin et al., the entire disclosure of which is incorporated herein by reference.

In a second phase of methods according to the preferred embodiments, a pattern of spacers is formed by pitch multiplication.

Figure 3A:
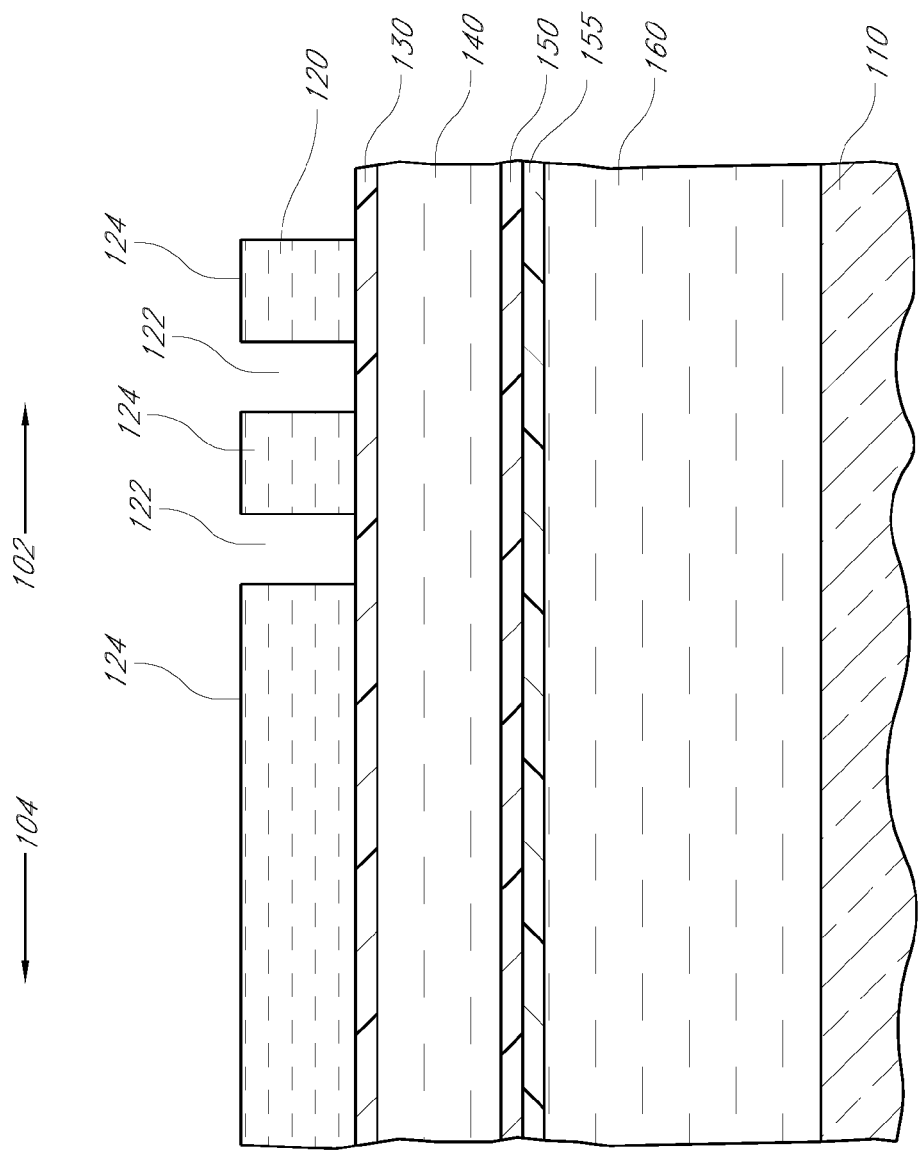
FIGS. 3A and 3B are schematic cross-sectional side and top plan views of the partially formed integrated circuit of FIG. 2 after forming lines in a photoresist layer in the array region of the integrated circuit, in accordance with preferred embodiments of the invention.
Figure 3B:
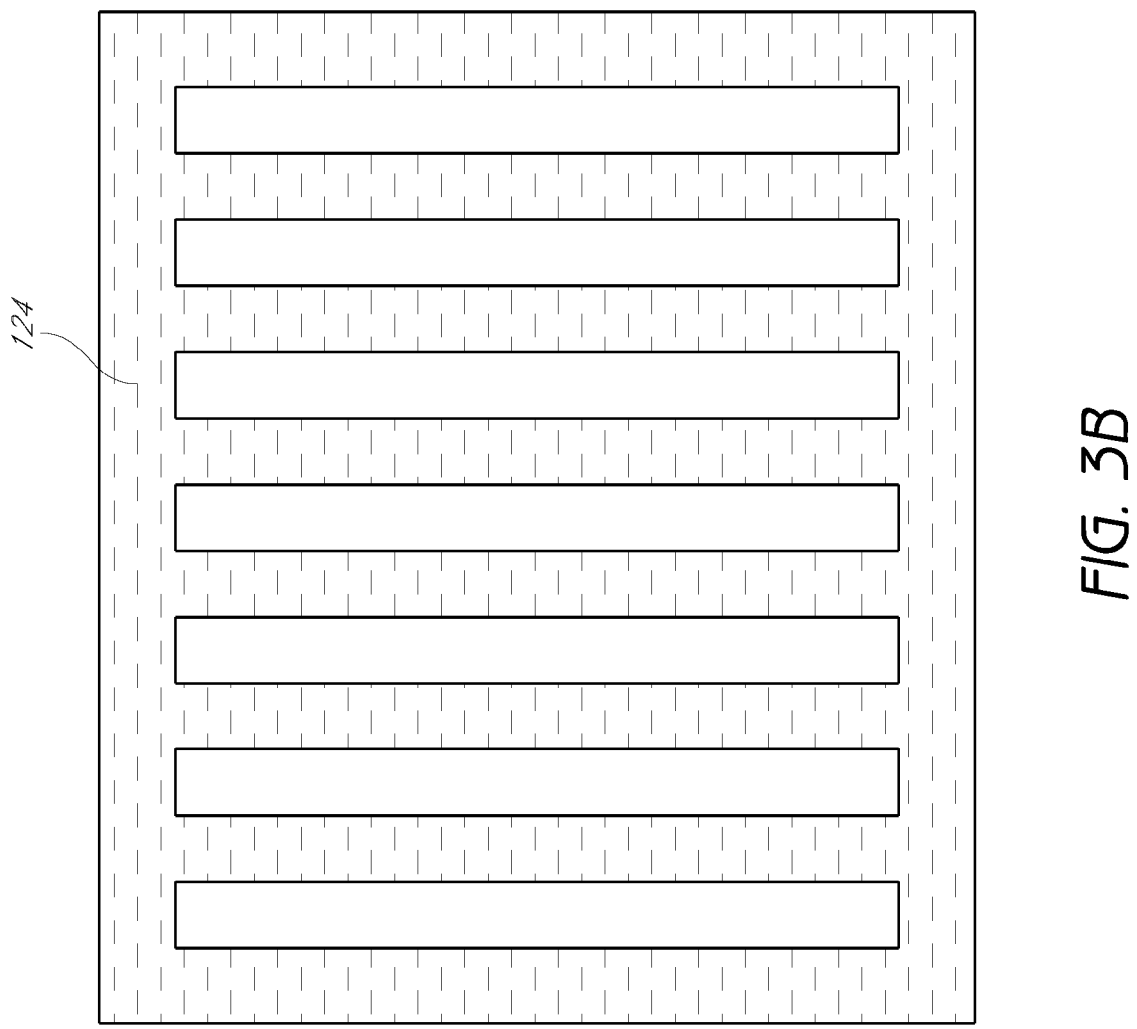

With reference to FIGS. 3A and 3B, a pattern comprising spaces or trenches 122, which are delimited by photodefinable material features 124, is formed in the photodefinable layer 120. The trenches 122 can be formed by, e.g., photolithography with 248 nm or 193 nm light, in which the layer 120 is exposed to radiation through a reticle and then developed. After being developed, the remaining photodefinable material, photoresist in the illustrated embodiment, forms mask features such as the illustrated lines 124 (shown in cross-section only).

The pitch of the resulting lines 124 is equal to the sum of the width of a line 124 and the width of a neighboring space 122. To minimize the critical dimensions of features formed using this pattern of lines 124 and spaces 122, the pitch can be at or near the limits of the photolithographic technique used to pattern the photodefinable layer 120. For example, for photolithography utilizing 248 mn light, the pitch of the lines 124 can be about 100 nm. Thus, the pitch may be at the minimum pitch of the photolithographic technique and the spacer pattern discussed below can advantageously have a pitch below the minimum pitch of the photolithographic technique. Alternatively, because the margin of error for position and feature size typically increases as the limits of a photolithographic technique are approached, the lines 124 can be formed having larger feature sizes, e.g., 200 nm, to minimize errors in the position and sizes of the lines 124.

Figure 4A:
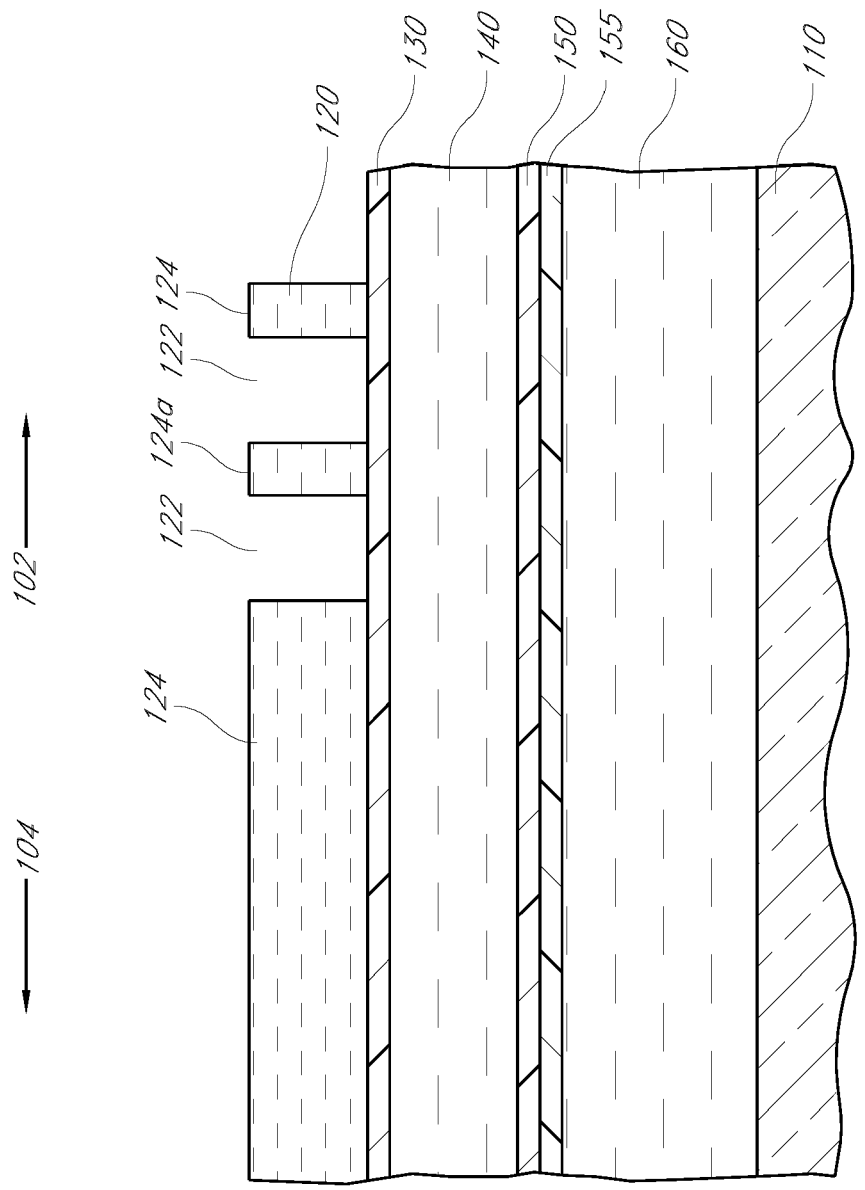
FIGS. 4A and 4B are schematic cross-sectional side and top plan views of the partially formed integrated circuit of FIGS. 3A and 3B after widening spaces between lines in the photoresist layer, in accordance with preferred embodiments of the invention.
Figure 4B:
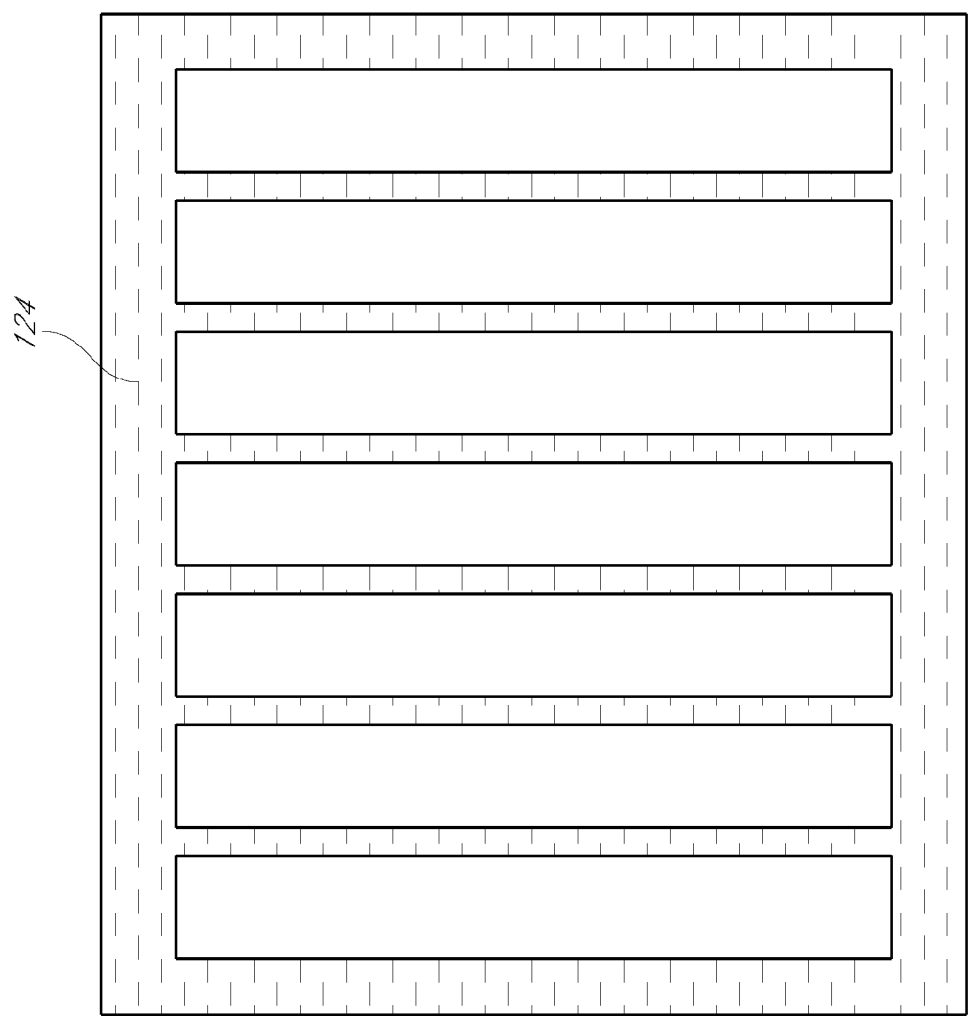

As shown in FIGS. 4A and 4B, the spaces 122 are preferably widened by etching the photoresist lines 124, to form modified spaces 122a and lines 124a. The photoresist lines 124 are preferably etched using an isotropic etch to "shrink" those features. Suitable etches include etches using an oxygen-containing plasma, e.g., a $SO_2/O_2/N_2/Ar$ plasma, a $Cl_2/O_2/He$ plasma or a $HBr/O_2/N_2$ plasma. The extent of the etch is preferably selected so that the widths of the lines 124a are substantially equal to the desired spacing between the later-formed spacers 175, as will be appreciated from the discussion below. For example, the width of the lines 124 can be reduced to from about 80-120 nm to about 40-70 nm. Advantageously, the width-reducing etch allows the lines 124a to be narrower than would otherwise be possible using the photolithographic technique used to pattern the photodefinable layer 120. In addition, the etch can smooth the edges of the lines 124a, thus improving the uniformity of those lines. While the critical dimensions of the lines 124a can be etched below the resolution limits of the photolithographic technique, it will be appreciated that this etch does not alter the pitch of the spaces 122a and lines 124a, since the distance between identical points in these features remains the same.

Figure 5:
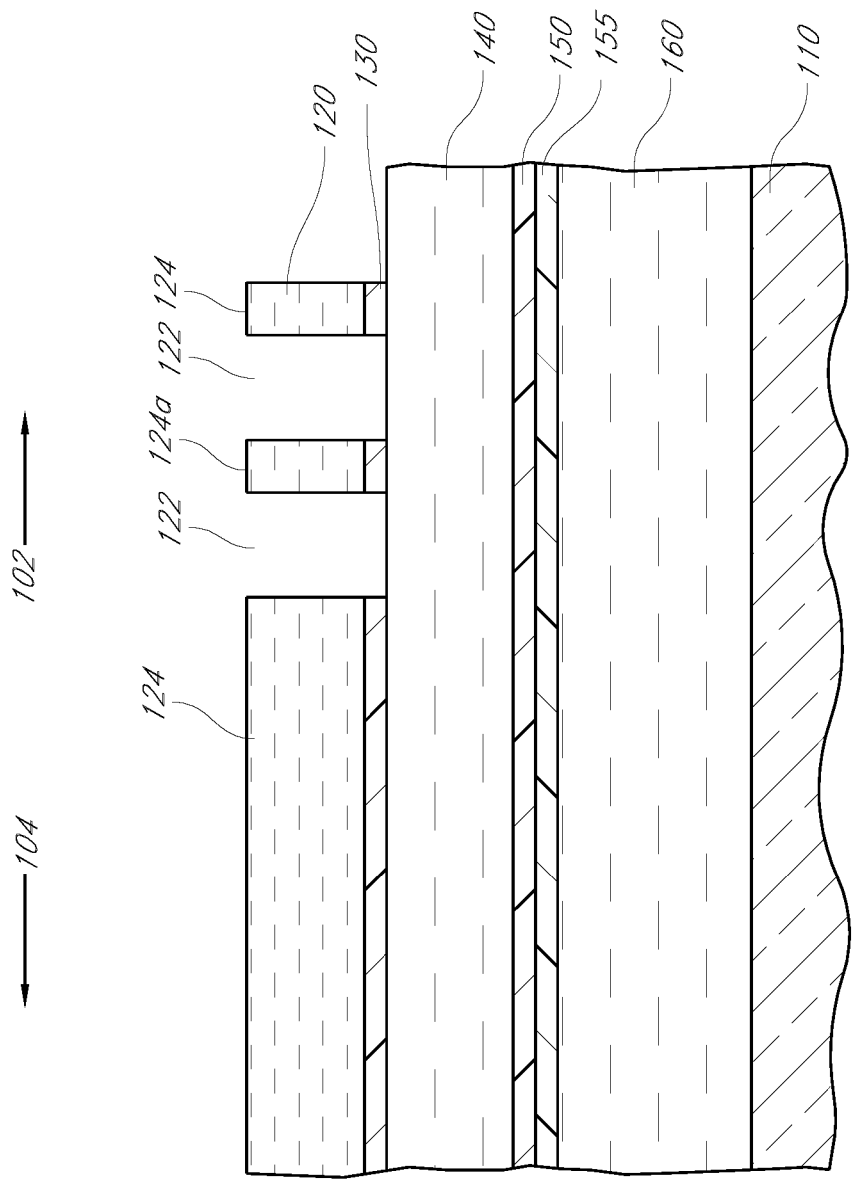
FIG. 5 is a schematic, cross-sectional side view of the partially formed integrated circuit of FIGS. 4A and 4B after etching through a first hard mask layer, in accordance with preferred embodiments of the invention.

With reference to FIG. 5, the pattern in the (modified) photodefinable layer 120a is transferred to the hard mask layer 130. This transfer is preferably accomplished using an anisotropic etch, such as an etch using a fluorocarbon plasma, although a wet (isotropic) etch may also be suitable if the hard mask layer 130 is thin. Preferred fluorocarbon plasma etch chemistries include $CFH_3$, $CF_2H_2$, $CF_3H$ and $CF_4/HBr$.

Figure 6:
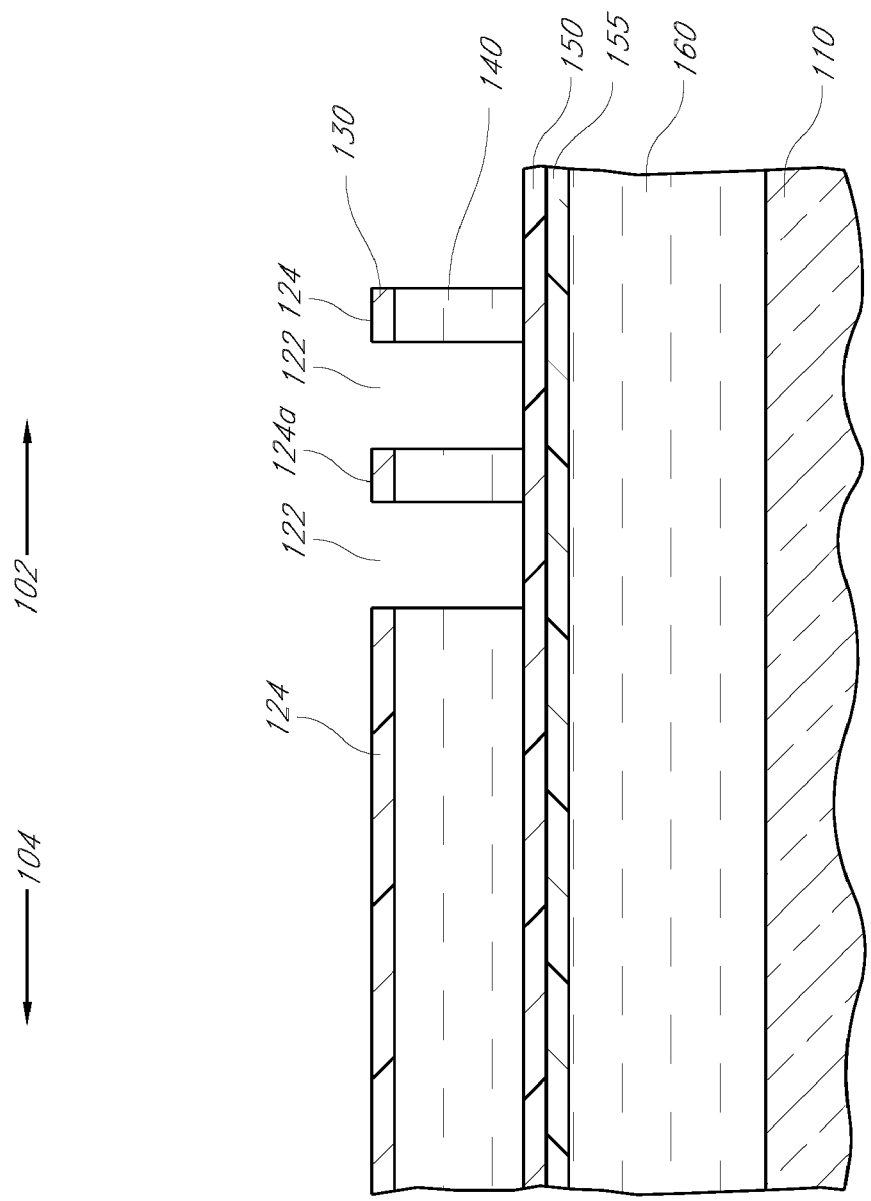
FIG. 6 is a schematic, cross-sectional side view of the partially formed integrated circuit of FIG. 5 after transferring a pattern from the hard mask layer to a temporary layer, in accordance with preferred embodiments of the invention.
Figure 8:
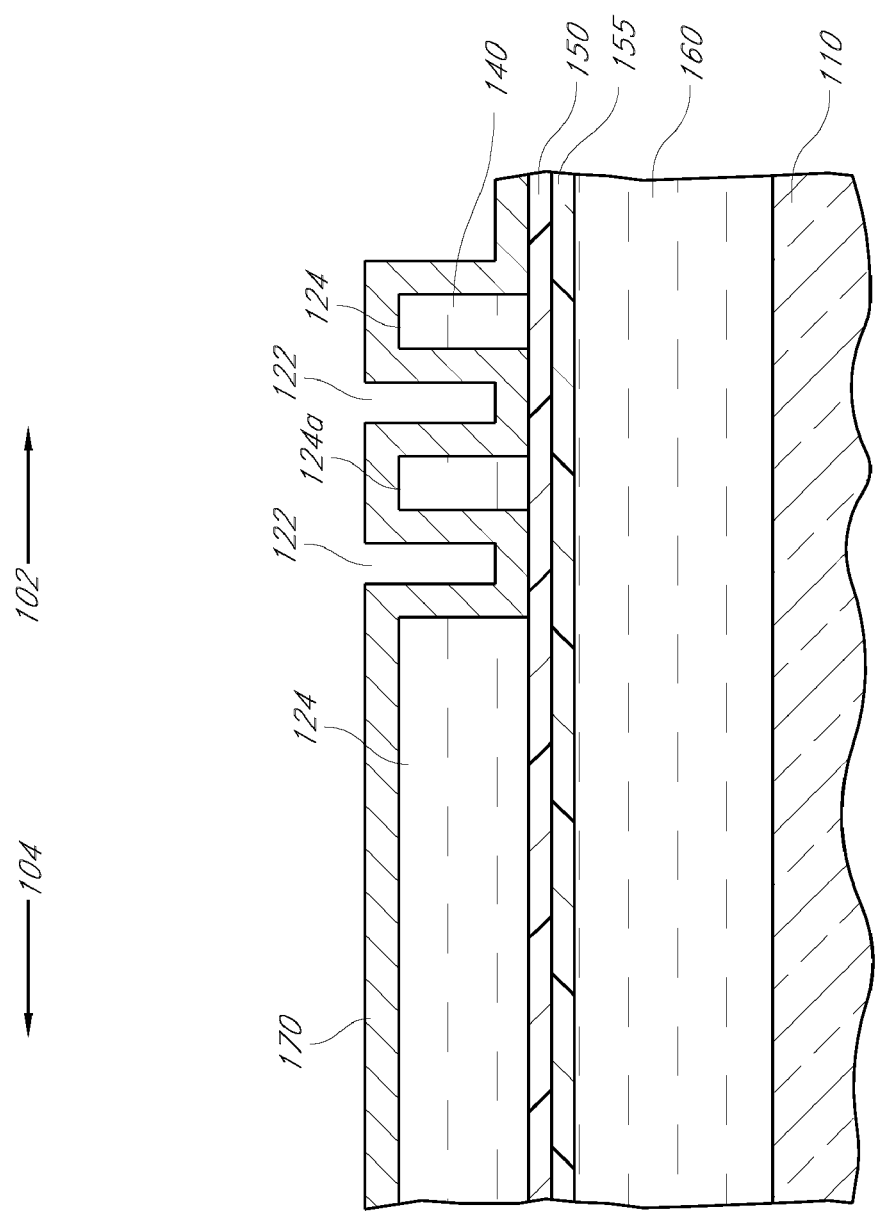
FIG. 8 is a schematic, cross-sectional side view of the partially formed integrated circuit of FIG. 7 after depositing a layer of a spacer material, in accordance with preferred embodiments of the invention.

With reference to FIG. 6, the pattern in the photodefinable layer 120a and the hard mask layer 130 is transferred to the temporary layer 140 to allow for deposition of a layer 170 of spacer material (FIG. 8). It has been found that the temperatures used for spacer material deposition are typically too high for photoresist to withstand. Thus, pattern is preferably transferred from the photodefinable layer 120a to the temporary layer 140, which is formed of a material that can withstand the process conditions for spacer material deposition and etch, discussed below. In addition to having higher heat resistance than photoresist, the material forming the temporary layer 140 is preferably selected such that it can be selectively removed relative to the material for the spacers 175 (FIG. 10) and the underlying etch stop layer 150. As noted above, the layer 140 is preferably formed of amorphous carbon and, more preferably, transparent carbon.

The pattern in the modified photodefinable layer 120a is preferably transferred to the temporary layer 140 using a $O_2$-containing plasma, e.g., a plasma containing $SO_2$, $O_2$ and Ar. Other suitable etch chemistries include a $Cl_2/O_2/SiCl_4$ or $SiCl_4/O_2/N_2$ or $HBr/O_2/N_2/SiCl_4$ containing plasma. Advantageously, the $SO_2$-containing plasma is used as it can etch carbon of the preferred temporary layer 140 at a rate greater than 20 times and, more preferably, greater than 40 times the rate that the hard mask layer 130 is etched. A suitable $SO_2$-containing plasma is described in U.S. patent application Ser. No. 10/931,772 to Abatchev et al, filed Aug. 31, 2004, the entire disclosure of which is incorporate herein by reference. It will be appreciated that the $SO_2$-containing plasma can simultaneously etch the temporary layer 140 and also remove the photodefinable layer 120a. The resulting lines 124b constitute the placeholders or mandrels along which a pattern of spacers 175 (FIG. 10) will be formed.

Figure 7:
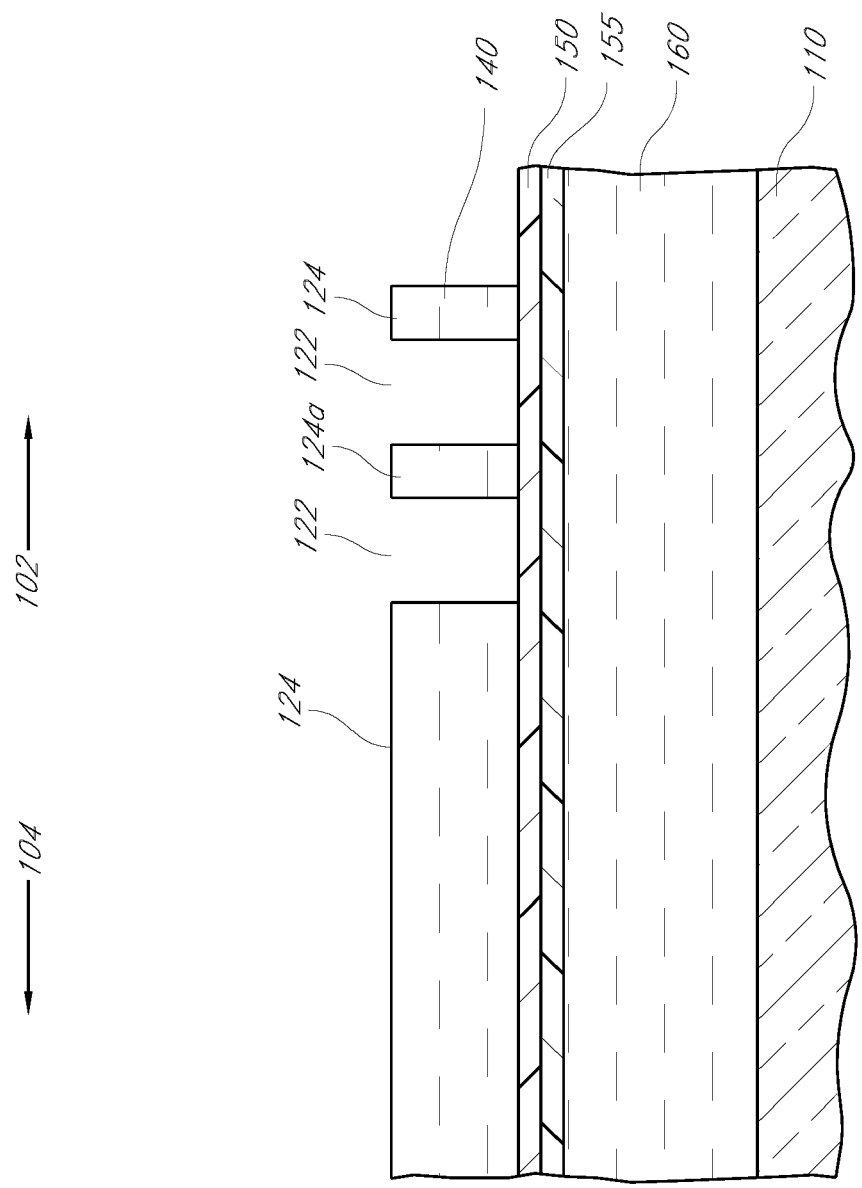
FIG. 7 is a schematic, cross-sectional side view of the partially formed integrated circuit of FIG. 6 after a hard mask layer removal, in accordance with preferred embodiments of the invention.
Figure 10:
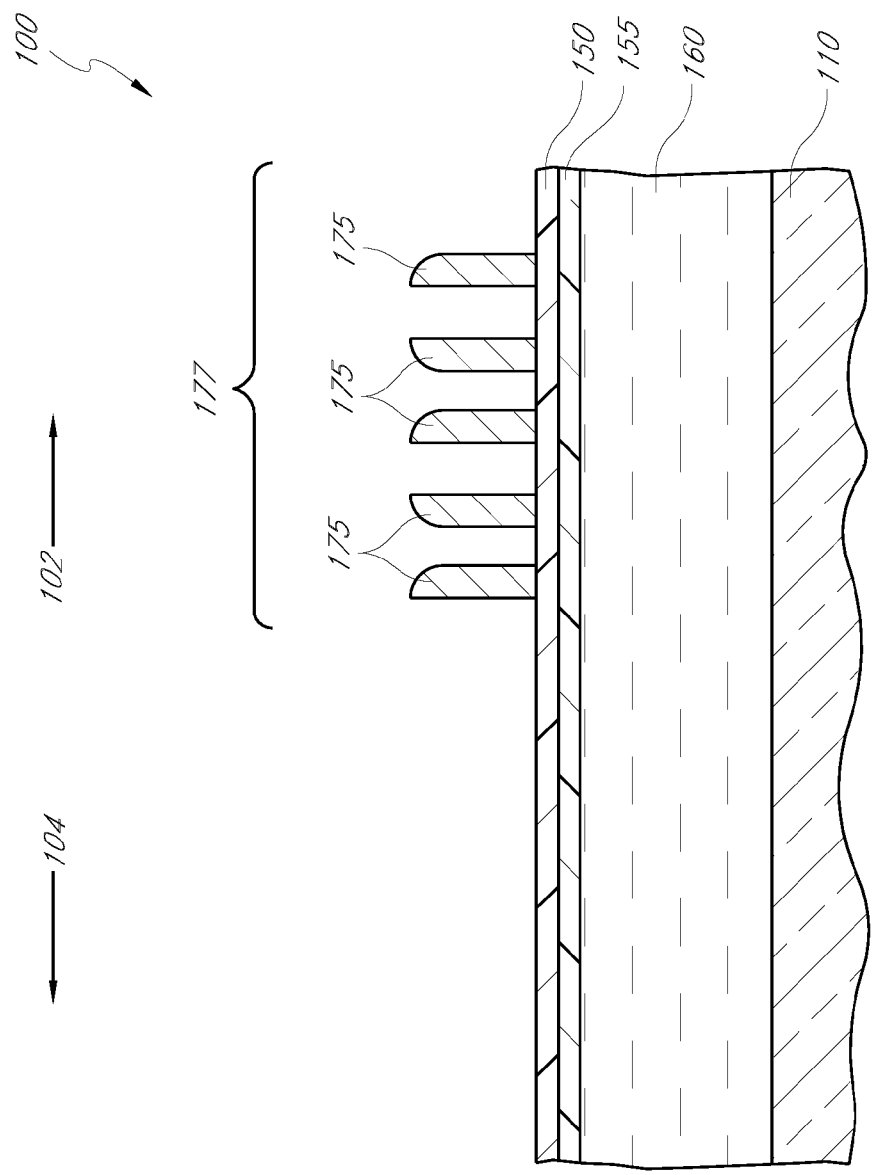
FIG. 10 is a schematic, cross-sectional side view of the partially formed integrated circuit of FIGS. 9A and 9B after removing a remaining portion of the temporary layer to leave a pattern of spacers in the array region of the integrated circuit, in accordance with preferred embodiments of the invention.

With reference to FIG. 7, the hard mask layer 130 can be removed to facilitate later spacer formation by leaving the temporary layer 140 exposed for subsequent etching (FIG. 10). The hard mask layer 130 can be removed using a buffered oxide etch (BOE), which is a wet etch comprising HF and $NH_4F$.

Next, as shown in FIG. 8, a layer 170 of spacer material is preferably blanket deposited conformally over exposed surfaces, including the hard mask layer 150 and the top and sidewalls of the temporary layer 140. The spacer material can be any material that can act as a mask for transferring a pattern to the underlying hard mask layer 150. The spacer material preferably: 1) can be deposited with good step coverage; 2) can be deposited at a temperature compatible with the temporary layer 140; and 3) can be selectively etched relative to the temporary layer 140 and underlying hard mask layer 150. Preferred materials include silicon, silicon oxides and silicon nitrides. In the illustrated embodiment, the spacer material is silicon oxide, which provides particular advantages in combination with other selected materials of the masking stack.

Preferred methods for spacer material deposition include chemical vapor deposition, e.g., using $O_3$ and TEOS to form silicon oxide, and atomic layer deposition, e.g., using a silicon precursor with an oxygen or nitrogen precursor to form silicon oxides and nitrides, respectively. The thickness of the layer 170 is preferably determined based upon the desired width of the spacers 175 (FIG. 10). For example, in the one exemplary embodiment, the layer 170 is preferably deposited to a thickness of about 20-80 nm and, more preferably, about 40-60 mn. Preferably, the step coverage is about 80% or greater and, more preferably, about 90% or greater.

Figure 9A:
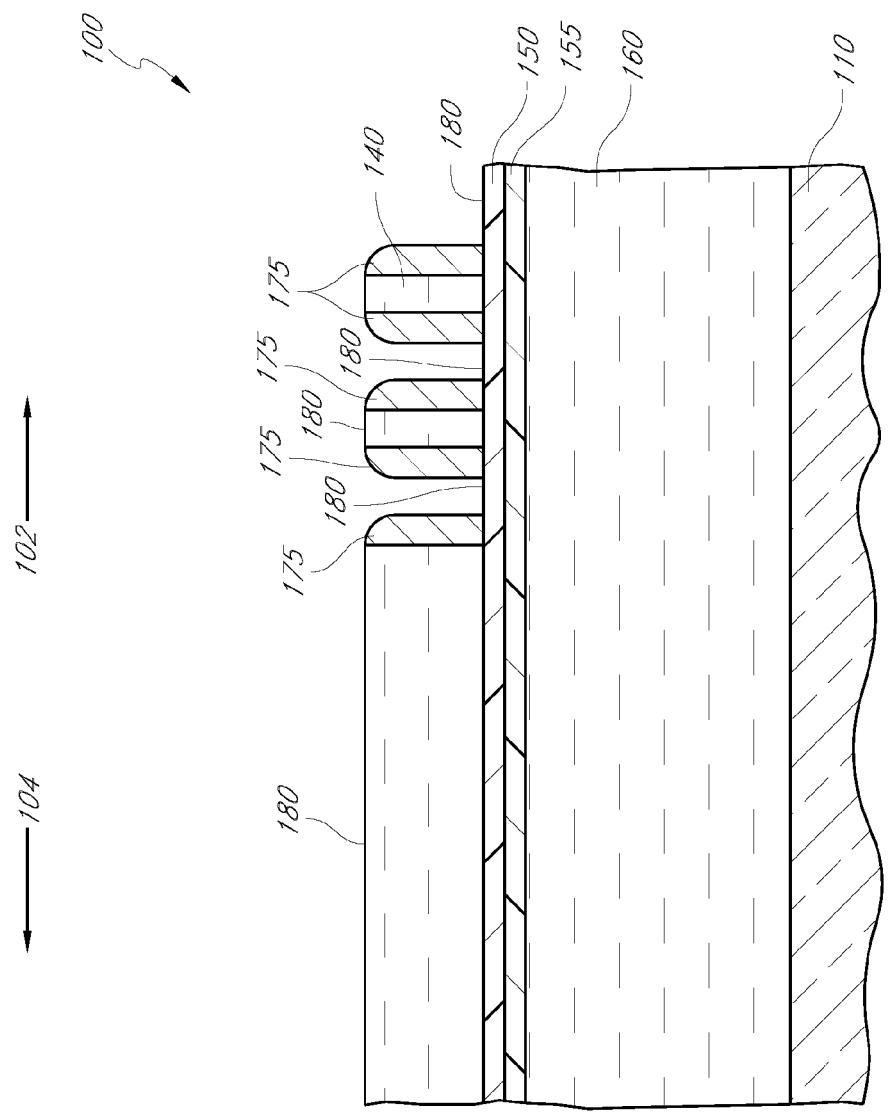
FIGS. 9A and 9B are schematic, cross-sectional side and top plan views of the partially formed integrated circuit of FIG. 8 after a spacer etch, in accordance with preferred embodiments of the invention.
Figure 9B:
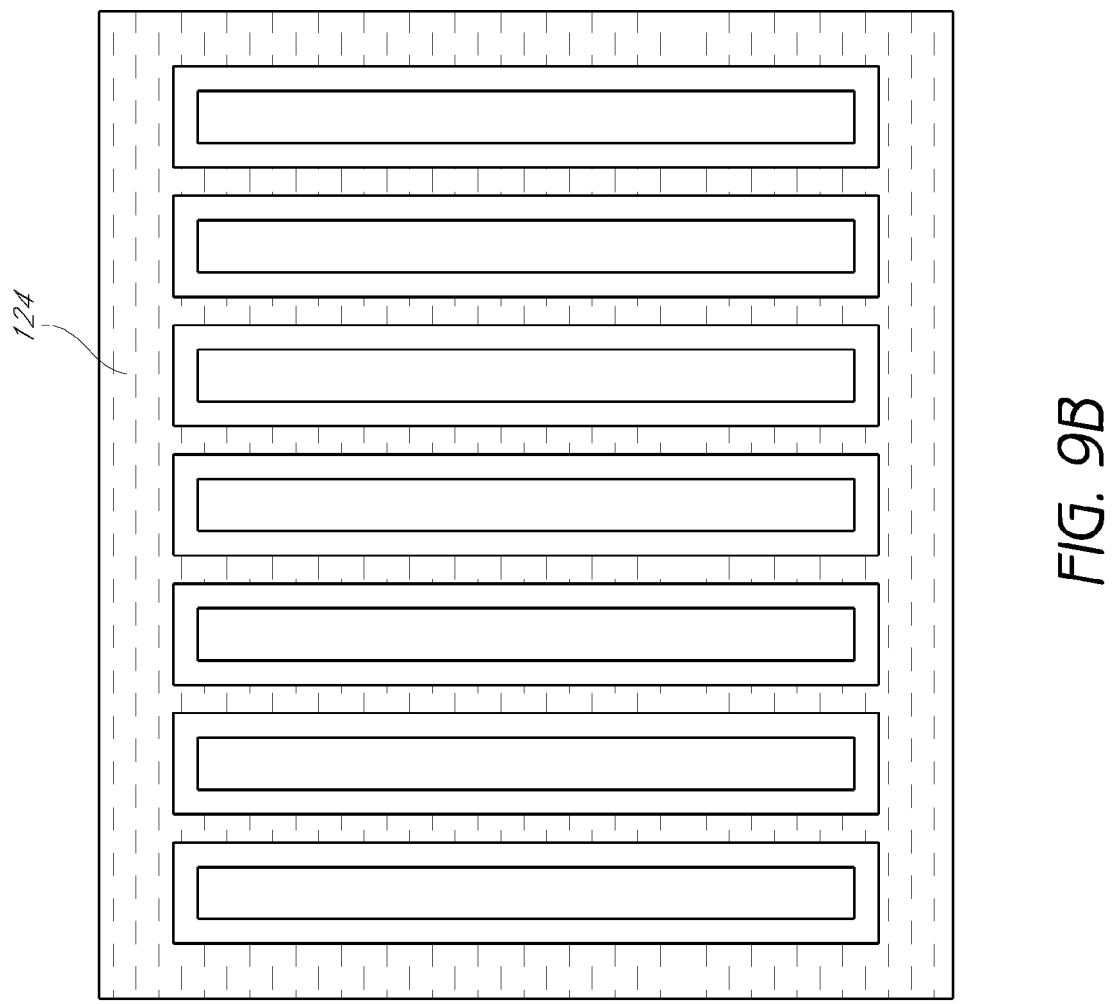

With reference to FIGS. 9A and 9B, the silicon oxide spacer layer 170 is then subjected to an anisotropic etch to remove spacer material from horizontal surfaces 180 of the partially formed integrated circuit 100. Such an etch, also known as a spacer etch, can be performed using a fluorocarbon plasma, e.g., containing $CF_4/CHF_3$, $C_4F_8/CH_2F_2$ or $CHF_3/Ar$ plasma.

With reference to FIG. 10, the temporary layer 140 is next removed to leave freestanding spacers 175. The temporary layer 140 is selectively removed using an organic strip process. Preferred etch chemistries include a oxygen-containing plasma etch, such as an etch using $SO_2$.

Thus, pitch multiplication has been accomplished. In the illustrated embodiment, the pitch of the spacers 175 is roughly half that of the photoresist lines 124 and spaces 122 (FIG. 3A) originally formed by photolithography. Where the photoresist lines 124 had a pitch of about 200 nm, spacers 175 having a pitch of about 100 nm or less can be formed. It will be appreciated that because the spacers 175 are formed on the sidewalls of the features or lines 124b, the spacers 175 generally follow the outline of the pattern of features or lines 124a in the modified photodefinable layer 120a and, so, typically form a closed loop in the spaces 122a between the lines 124a. The spacers 175 form a first pattern 177.

Next, in a third phase of methods according to the preferred embodiments, a second pattern is formed over the first pattern 177. Preferably, the second pattern comprises features having larger critical dimensions than the first pattern 177. In addition, the second pattern can be formed completely, partially, or not overlapping the first pattern 177.

Figure 11:
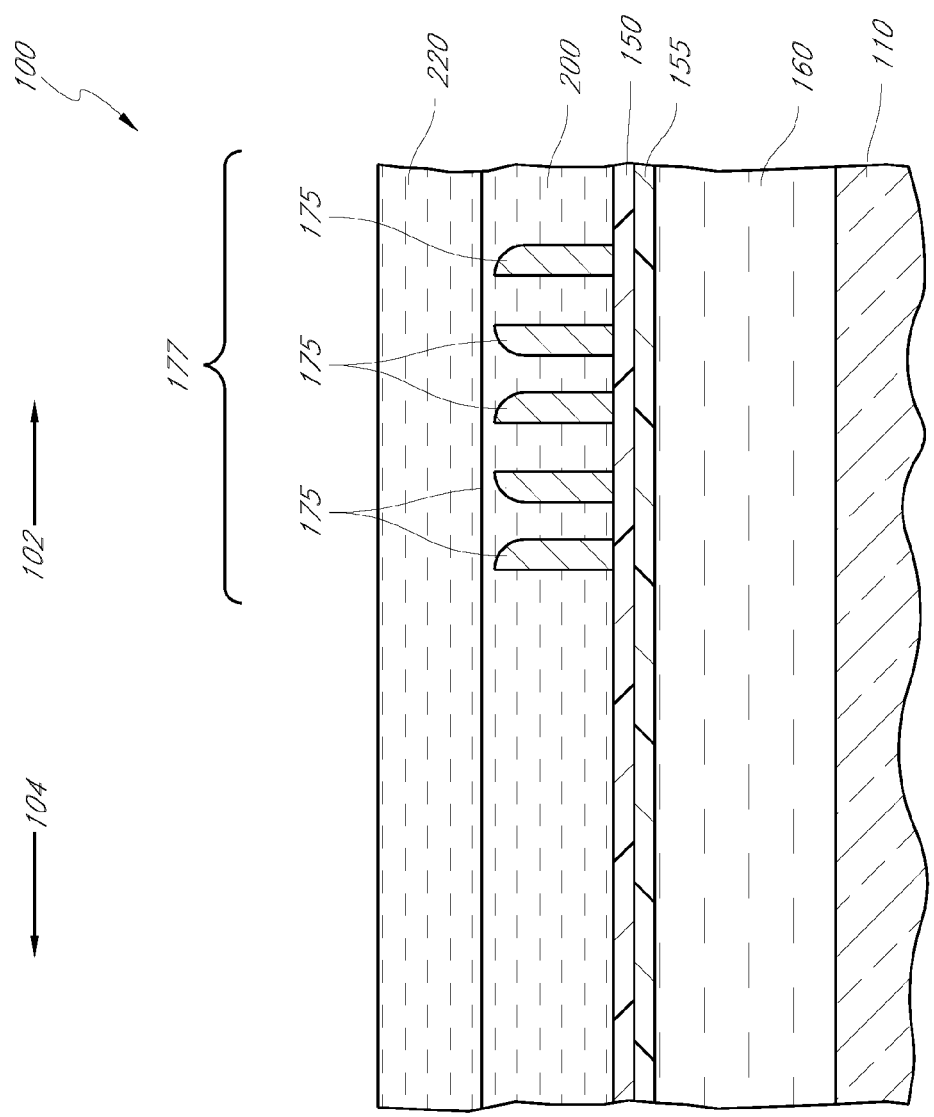
FIG. 11 is a schematic, cross-sectional side view of the partially formed integrated circuit of FIG. 10 after surrounding the spacers with a removable planarizing material and forming a photoresist layer over the spacers, in accordance with preferred embodiments of the invention.

To allow the second pattern to be formed, a planar surface is formed by depositing a planarizing material around the spacers 175 to form a planarizing layer 200, as shown in FIG. 11. A selectively definable layer 220 is then formed on the planarizing material to allow for patterning of the second pattern at the periphery 104.

The planarizing layer 200 is preferably at least as tall as the spacers 175. In addition, the protective layer 200 is preferably formed of a material that can be selectively etched relative to both the spacers 175 and the selectively definable layer 220. For example, the planarizing layer 200 can be formed of a spin-on anti-reflective coating, such as a bottom anti-reflective coating (BARC).

As with the selectively definable layer 120, the selectively definable layer 220 is preferably photodefinable, e.g., formed of a photoresist, including any photoresist known in the art. In addition, in other embodiments, the layer 220 can be formed of a resist suitable for patterning by nano-imprint lithography.

In some preferred embodiments, the planarizing layer 200 can be omitted and the selectively definable layer 220 can be formed directly on and around the spacers 175. Such a scheme can be employed where the patterns can be defined in the layer 220 with good integrity and where the resolution enhancement properties of an anti-reflective coating are not desired. For example, the anti-reflective coating can be omitted if the material underlying the selectively definable layer 220 is sufficiently non-reflective.

Figure 12:
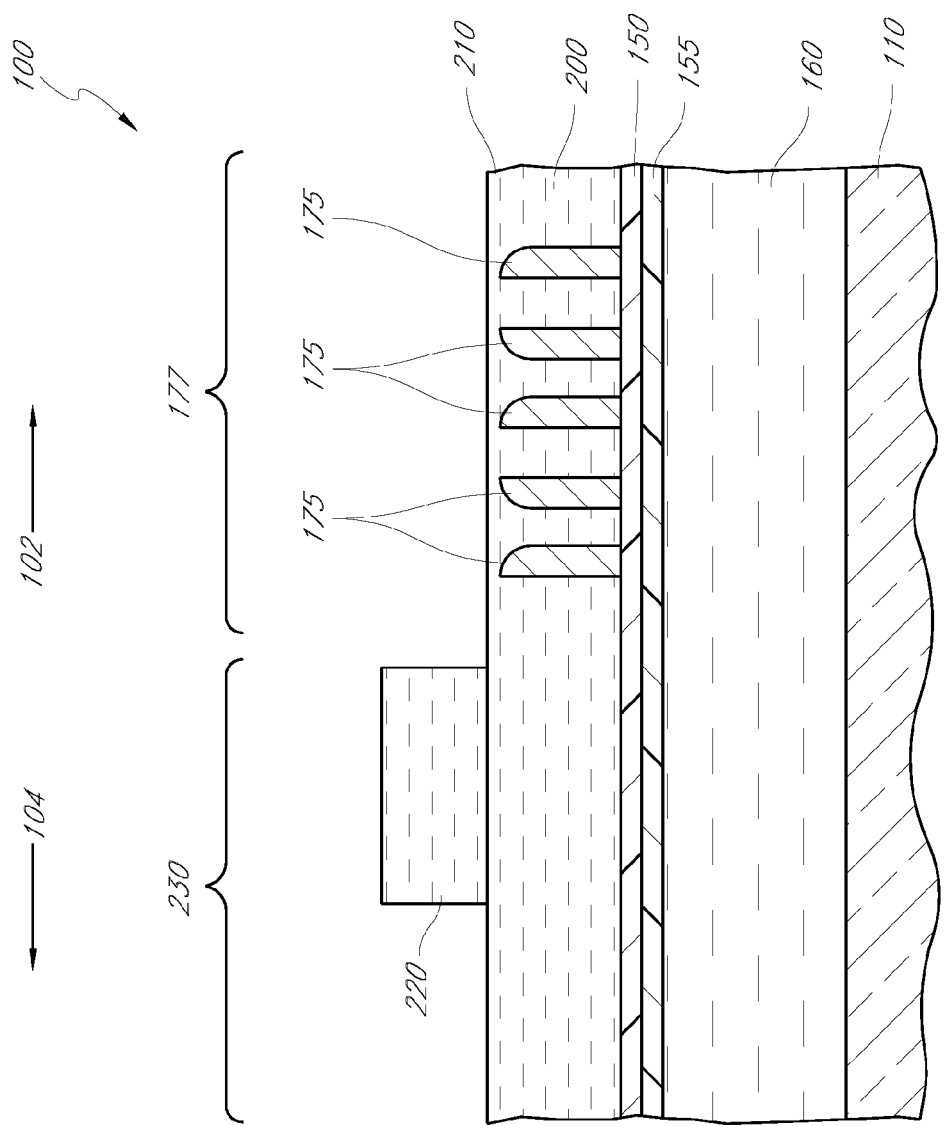
FIG. 12 is a schematic, cross-sectional side view of the partially formed integrated circuit of FIG. 11 after forming a pattern in the photoresist layer in the periphery of the integrated circuit, in accordance with preferred embodiments of the invention.

With reference to FIG. 12, the photodefinable layer 220 is patterned using, e.g., the same photolithographic technique used to pattern the photodefinable layer 120. Thus, a pattern 230 is formed in the photodefinable layer 220. Where the pattern 230 is used to mask features in the periphery 104, the area in the photodefinable layer 220 in the array 102 is preferably open, as illustrated. As noted above, however, while illustrated laterally adjacent the pattern 177, the pattern 230 can partially or completely overlap the pattern 177 or be completely separated from the pattern 177. Thus, the use of different reference numerals (177 and 230) for these patterns indicates that they were originally formed in different steps.

While the pattern 177 preferably has a pitch or feature size smaller than the minimum pitch or resolution of the photolithographic technique used in forming it, the pattern 230 preferably has a pitch or feature size equal to or greater than the minimum pitch or resolution of the photolithographic technique used to form that pattern. It will be appreciated that the pattern 230 at the periphery 104 can be used to form landing pads, transistors, local interconnects, etc.

In a fourth phase of methods according to the preferred embodiments, the patterns 177 and 230 are consolidated on one level below the spacers and simultaneously transferred to the substrate 110.

Figure 13:
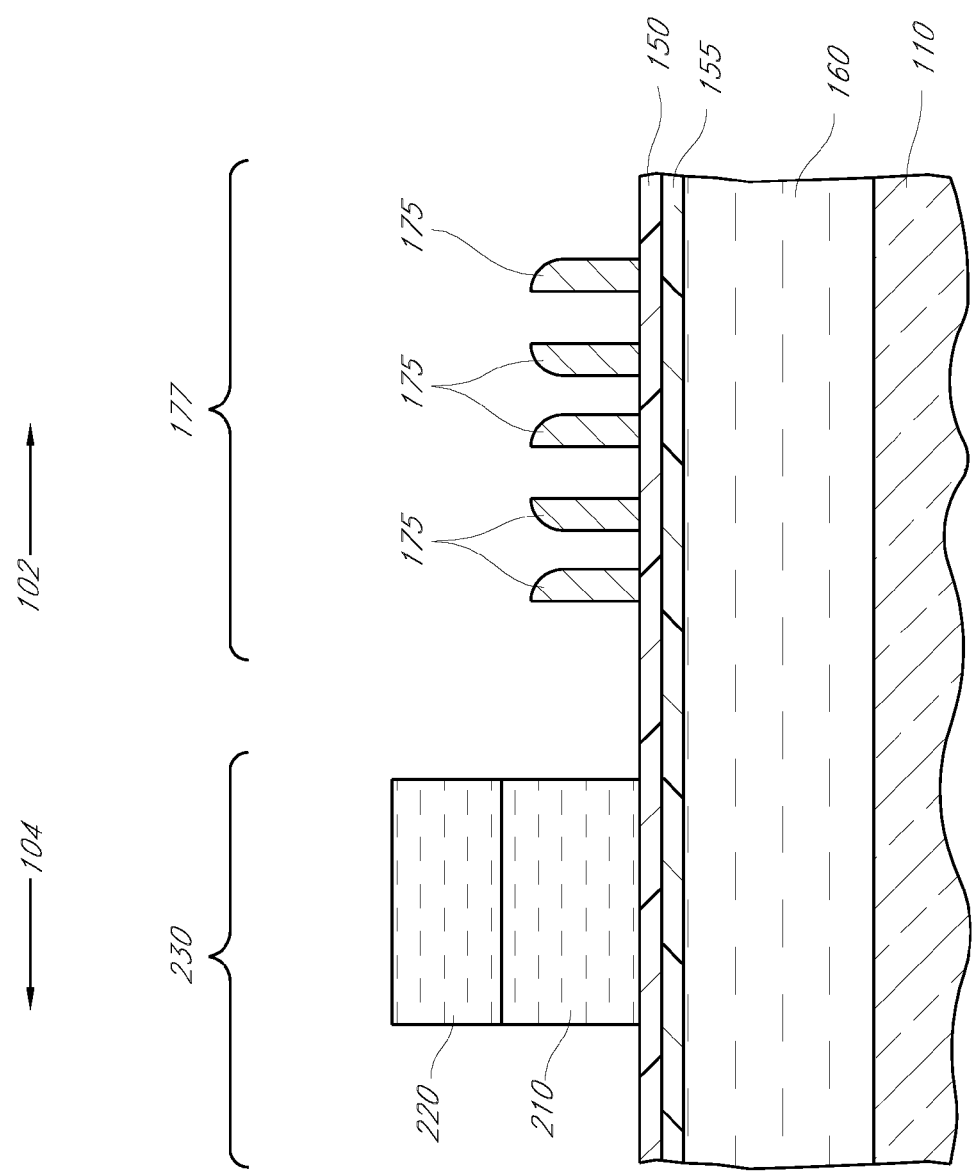
FIG. 13 is a schematic, cross-sectional side view of the partially formed integrated circuit of FIG. 12 after transferring the pattern from the photoresist layer to the planarizing material at the same level as the spacers, in accordance with preferred embodiments of the invention.

With reference to FIG. 13, the pattern 230 is transferred to the same level as the pattern 177 of spacers 175. An anisotropic BARC etch is performed to define the periphery features in the protective layer 210 and to also open up the array features. The parts of the protective layer 210 that are unprotected by parts of the photodefinable layer 220 are preferably selectively etched using an anisotropic etch, using, e.g., a $HBr/O_2$ plasma or a $SO_2$-containing plasma. This etch preferentially removes the protective layer 200 around the oxide spacers 175, thereby leaving those spacers 175 exposed.

Figure 14:
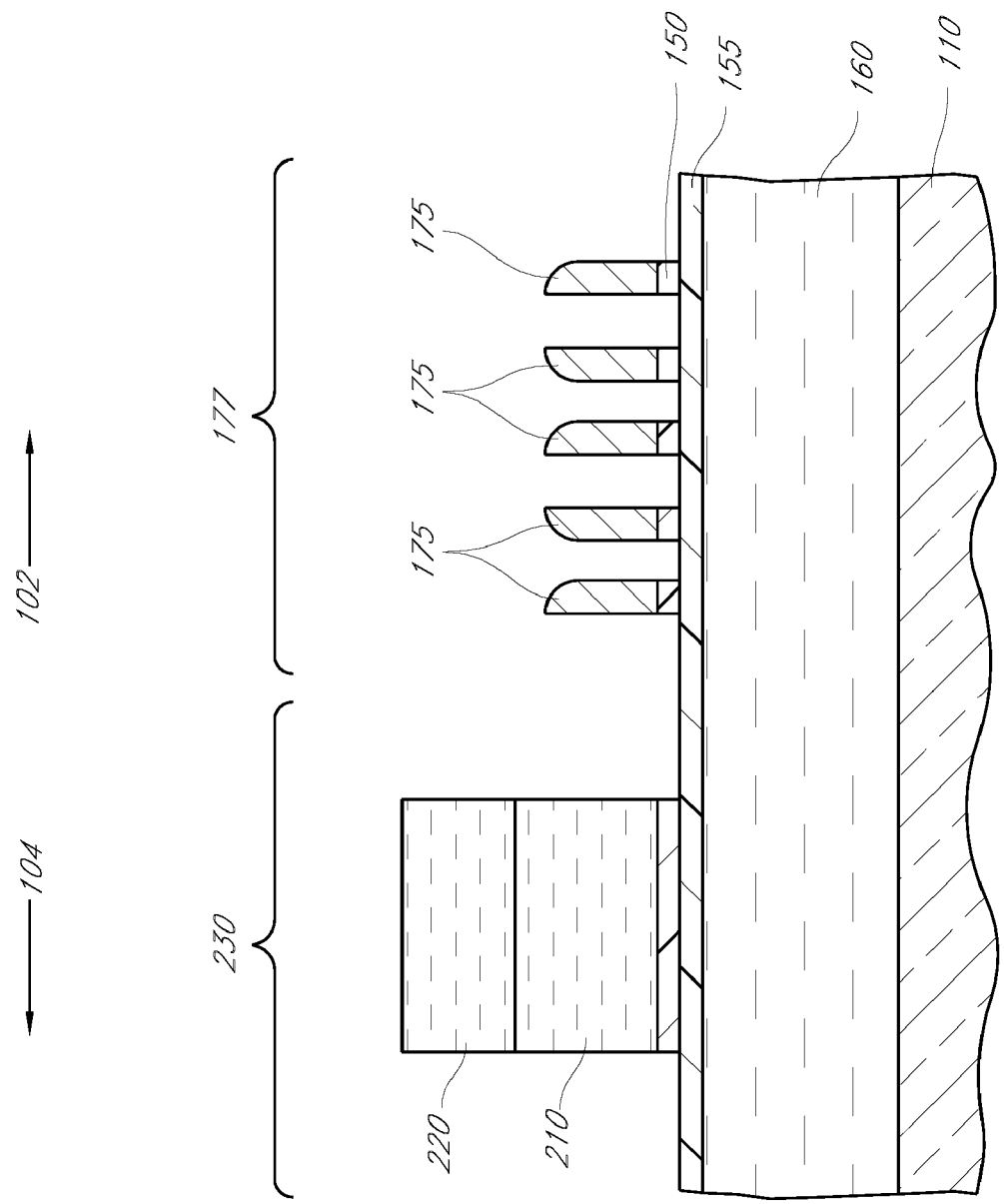
FIG. 14 is a schematic, cross-sectional side view of the partially formed integrated circuit of FIG. 13 after etching the pattern in the periphery and the spacer pattern in the array into an underlying hard mask layer, in accordance with preferred embodiments of the invention.
Figure 15:
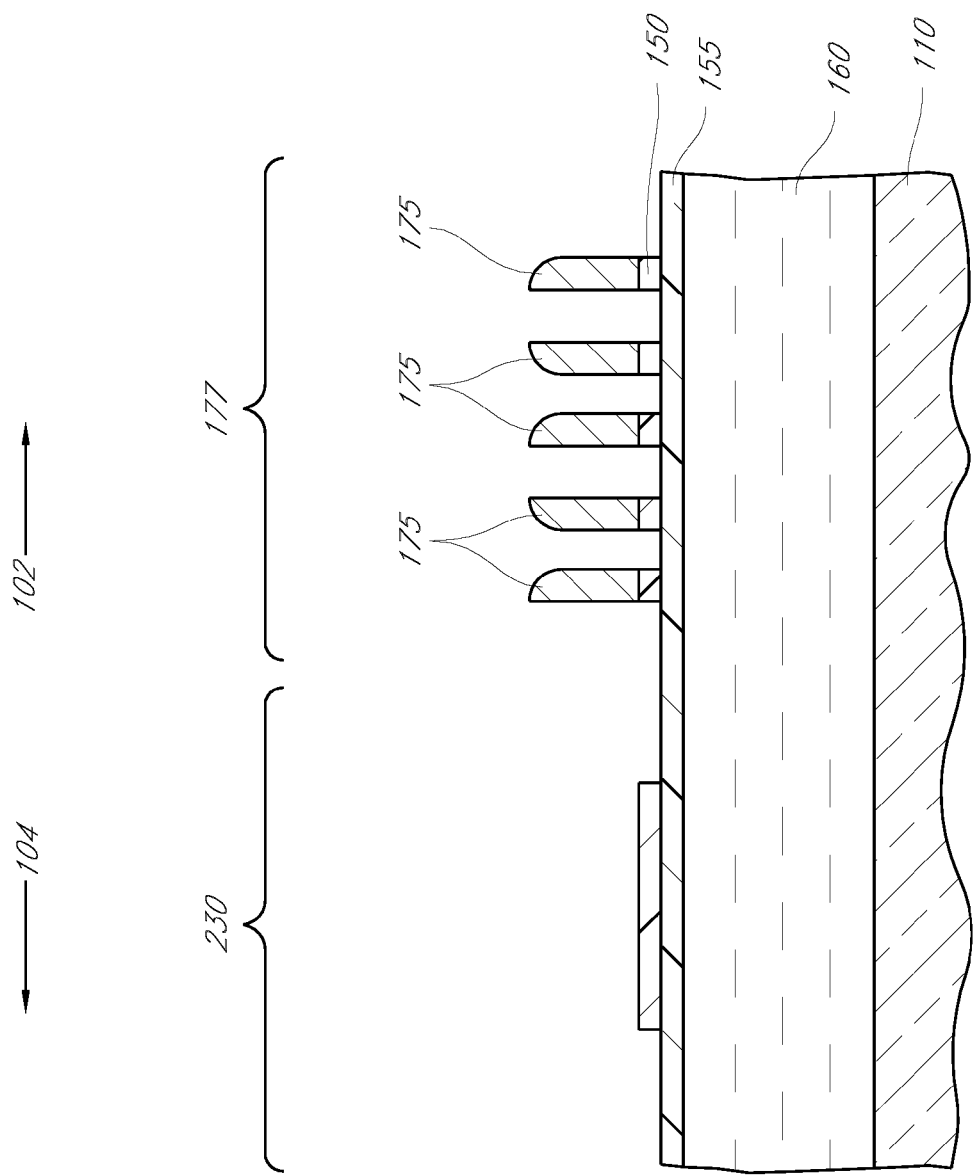
FIG. 15 is a schematic, cross-sectional side view of the partially formed integrated circuit of FIG. 14 after performing a pattern clean step to remove the photoresist and patterned planarizing material, in accordance with preferred embodiments of the invention.
Figure 16:
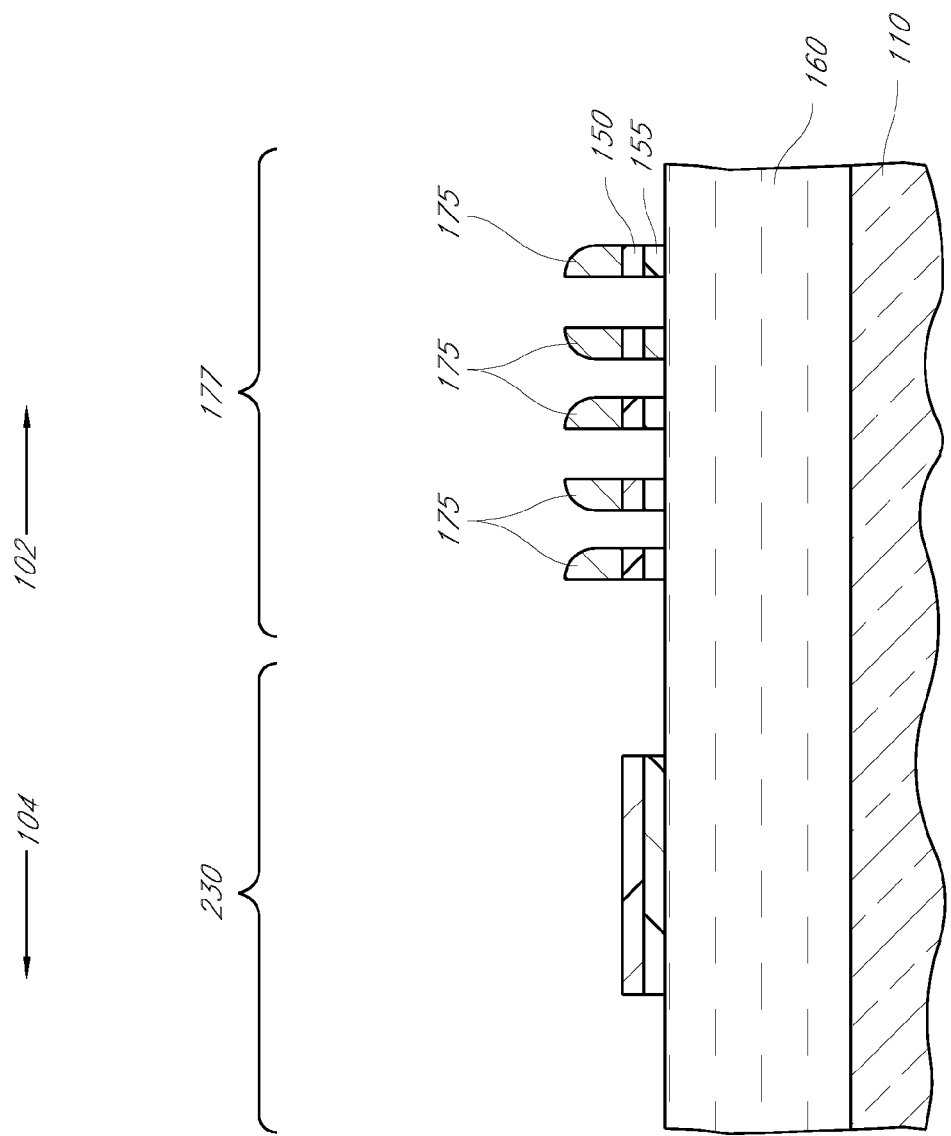
FIG. 16 is a schematic, cross-sectional side view of the partially formed integrated circuit of FIG. 15 after etching the pattern in the periphery and the spacer pattern in the array into another underlying hard mask layer, in accordance with preferred embodiments of the invention.

With reference to FIGS. 14-16, the second and third hard mask layers are etched to transfer the patterns 177 and 230 down to the primary mask layer 160, to form a mixed pattern in the primary mask layer 160. With reference to FIG. 14, the patterns 177 and 230 are first both transferred to the second hard mask layer 150. Where the second hard mask 150 is formed of amorphous silicon, it is preferably anisotropically etched using, e.g., a HBr and $Cl_2$ containing plasma. Such an etch preferably etches the amorphous silicon at a rate greater than about 5 times and, more preferably, greater than about 10 times the rate at which the silicon oxide spacers 175 and silicon oxide third hard mask 155 can be etched.

With reference to FIG. 15, the first and second patterns 177 and 230 are cleaned. As noted above, the carbon material forming the photoresist and DARC layers 220 and 210 can polymerize upon contact with etchants. For example, the $HBr/Cl_2$ etch of the second hard mask layer 150 can cause parts of the layers 220 and 210 to polymerize and leave a residue around features in the second hard mask layer 150, causing a pattern having undesirably non-uniform features. Thus, the patterns 177 and 230 are preferably cleaned by stripping off an organic material. The strip can be accomplished using, e.g., an isotropic etch with $O_2$ plasma.

With reference to FIG. 16, the patterns 177 and 230 are then both transferred to the third hard mask layer 155. Where the third hard mask 155 is formed of a LSO, it is preferably anisotropically etched using, e.g., a fluorocarbon plasma. The fluorocarbon plasma preferably includes $C_4F_8$, $CH_2F_2$, Ar and $O_2$ and can preferably etch the silicon oxide and the amorphous carbon at equal rates and, more preferably, can etch the silicon oxide at a rate greater than about 10 times the rate at which the amorphous silicon layer 150 is etched.

Figure 17:
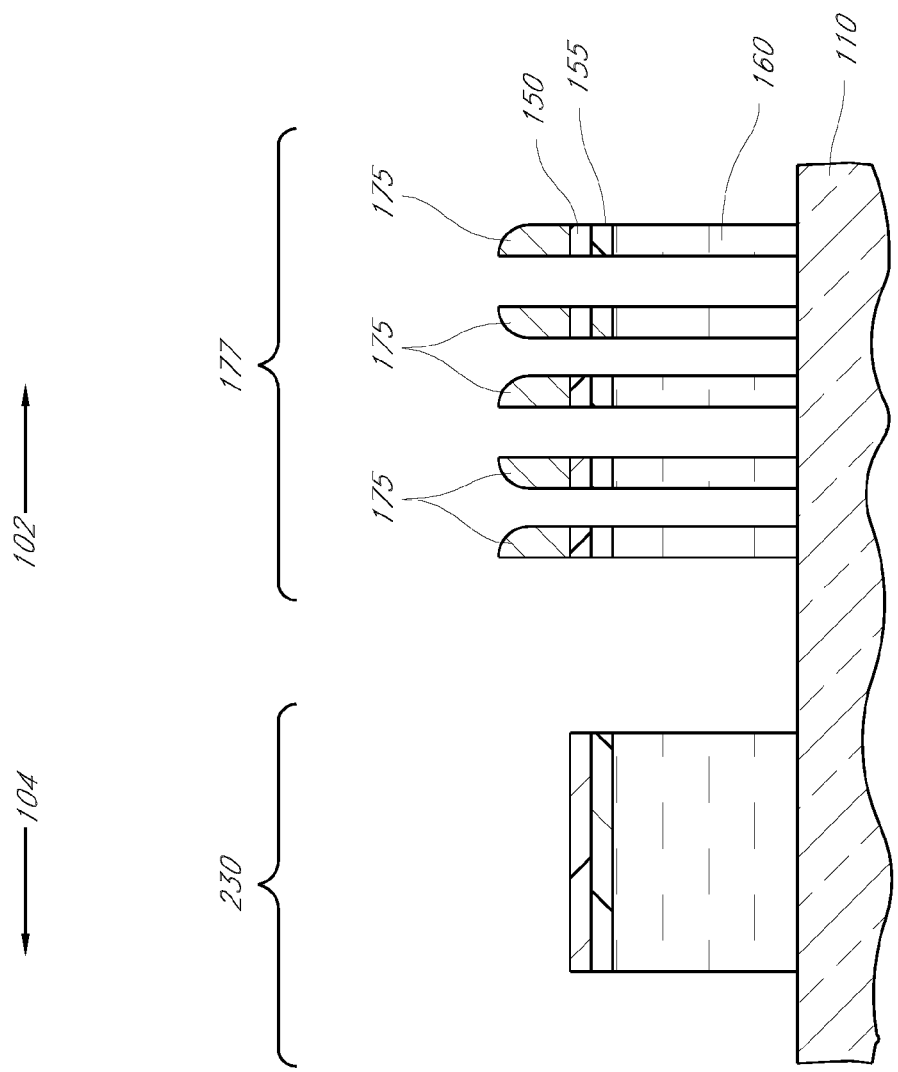
FIG. 17 is a schematic, cross-sectional side view of the partially formed integrated circuit of FIG. 16 after transferring both the pattern in the periphery and the spacer pattern in the array to a primary mask layer, in accordance with preferred embodiments of the invention.

With reference to FIG. 17, the patterns 177 and 230 are transferred to the primary mask layer 160. The transfer is preferably accomplished by anisotropically etching the primary mask layer 160, preferably using a $SO_2$-containing plasma. Other suitable etch chemistries include a $Cl_2/O_2$, $HBr/O_2/N_2$ or $SiCl_4/O_2/N_2/HBr$ or $SiCl_4/O_2$-containing plasma. As noted above, the $SO_2$-containing plasma is preferably used as it has been found to have excellent selectivity for the amorphous carbon of the primary mask layer 160 relative to the hard mask layers 150 and 155. Thus, a thick enough mask can be formed in the primary mask layer 160 to later effectively transfer the mask pattern to the substrate 110, particularly through multiple materials of the substrate using selective etch chemistries and without wearing away the primary mask layer 160 before the pattern transfer is complete.

Figure 18:
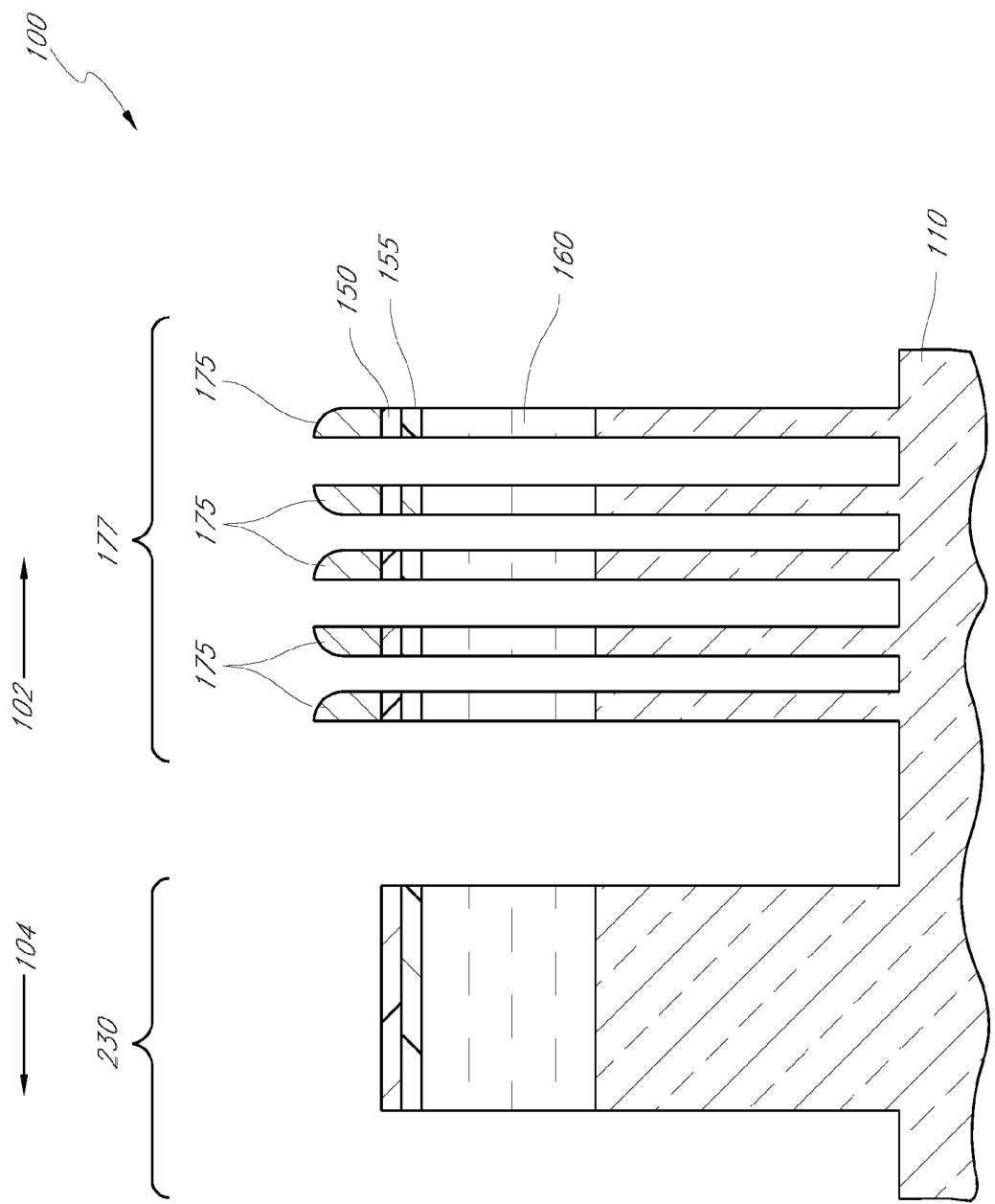
FIG. 18 is a schematic, cross-sectional side view of the partially formed integrated circuit of FIG. 17 after transferring the periphery pattern and the spacer pattern to the underlying substrate, in accordance with preferred embodiments of the invention.

With reference to FIG. 18, after being transferred to the primary mask layer 160, the patterns 177 and 230 are transferred to the substrate 110 using the layer 160 as a mask. Given the disparate materials typically used for the primary mask layer 160 and the substrate 110 (e.g., amorphous carbon and silicon or silicon compounds, respectively), the pattern transfer can be readily accomplished using etch chemistries appropriate for etching the material or materials of the substrate 110. For example, a fluorocarbon etch comprising $CF_4$, $CHF_3$ and/or $NF_3$ containing plasma can be used to etch silicon nitride, a fluorocarbon etch comprising $CF_4$, $CHF_3$, $CH_2F_2$ and/or $C_4F_8$ containing plasma can be used to etch silicon oxide and a HBr, $Cl_2$, $NF_3$, $SF_6$ and/or $CF_4$ containing plasma etch can be used to etch silicon. In addition, the skilled artisan can readily determine suitable etch chemistries for other substrate materials, such as conductors, including aluminum, transition metals, and transition metal nitrides. For example, an aluminum substrate can be etched using a fluorocarbon etch.

It will be appreciated that where the substrate 110 comprises layers of different materials, a succession of different chemistries, preferably dry-etch chemistries, can be used to successively etch through these different layers, if a single chemistry is not sufficient to etch all the different materials. It will also be appreciated that, depending upon the chemistry or chemistries used, the spacers 175 and the hard mask layer 150 may be etched. Using amorphous carbon for the primary mask layer 160, however, advantageously offers excellent resistance to conventional etch chemistries, especially those used for etching silicon-containing materials. Thus, the primary mask layer 160 can effectively be used as a mask for etching through a plurality of substrate layers, or for forming high aspect ratio trenches. In addition, the pitch doubled pattern 177 and the pattern 230 formed by conventional lithography can simultaneously be transferred to the substrate 110, or each individual layer of the substrate 110, in a single etch step.

In one example, the sequence of substrate layers 110a-110d can be etched using various etch chemistries, which preferably anisotropically etch the various layers. The silicide layer 110a can be etched using a $Cl_2/CF_4$ plasma at a pressure of about 3-10 mTorr, with about 200-350 watt source power and about 50-100 watt bias power; the polysilicon layer 110b can etched be using a $HBr/Cl_2$ plasma at a pressure of about 10-30 mTorr, with about 300-500 watt source power and about 20-50 watt bias power; the oxide-nitride-oxide (ONO) composite layer 110c can be etched using a $CF_4/CH_2F_2/He$ plasma at a pressure of about 5-10 mTorr, with about 600-1000 watt soruce power and about 200-400 watt bias power; and the polysilicon layer 110d can be etched using a $HBr/He/O_2$ plasma at a pressure of about 40-80 mTorr, with about 250-400 watt soruce power and about 50-100 watt bias power.

Figure 19:
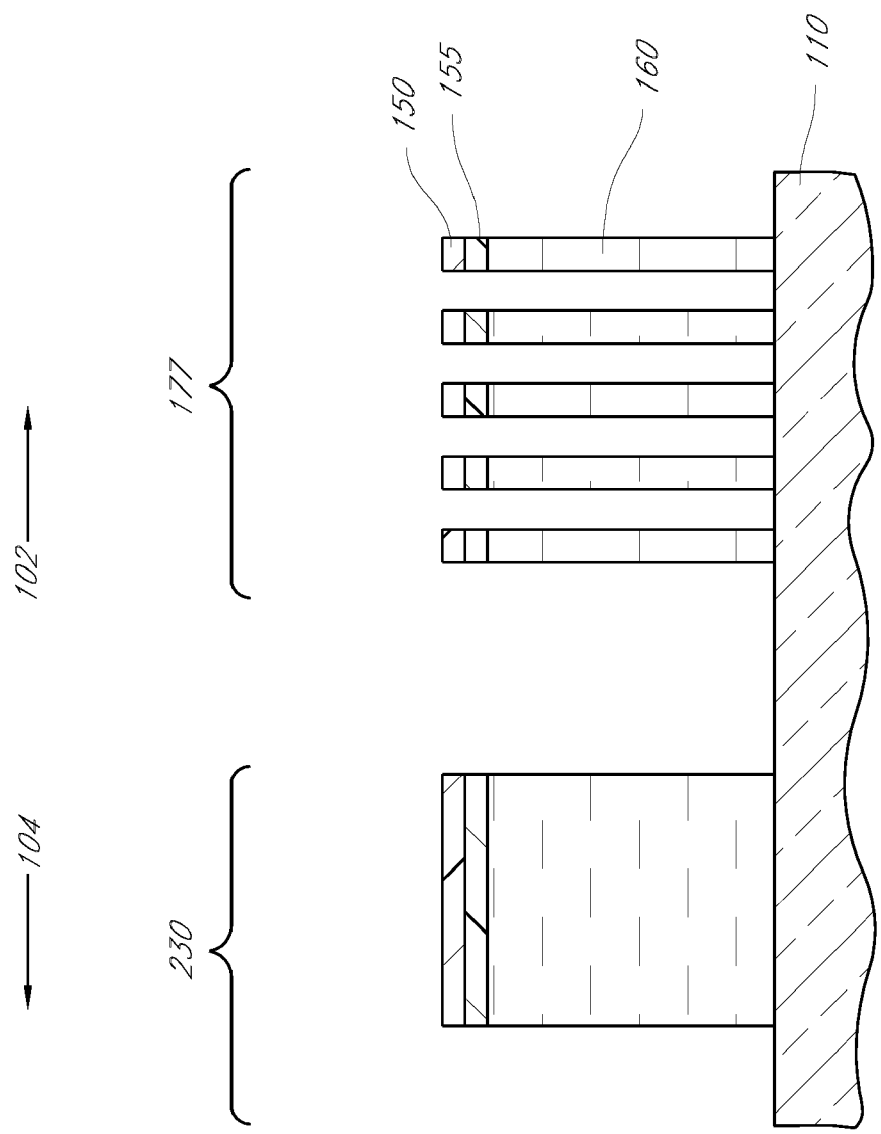
FIG. 19 is a schematic, cross-sectional side view of the partially formed integrated circuit of FIG. 17 after performing a spacer removal and before transferring the pattern into the substrate, in accordance with other preferred embodiments of the invention.

With reference to FIG. 19, in some preferred embodiments, the spacers 175 can be removed before using the primary mask layer 160 to transfer the patterns 177 and 230 to the substrate 110. The removal is preferably performed using an etch selective for the spacers 175. For example, where the spacers 175 comprise a silicon oxide, the spacer removal can be accomplished using a wet or dry etch, e.g., a wet buffered oxide etch or a dry etch using a $CH_2F_2/C_4F_8/Ar/O_2$ plasma. As noted above, this spacer removal can advantageously straighten and/or stabilize the profile of the features forming the patterns 177 and 230, especially where the features are taller than optimal for etching the substrate 110.

Figure 20:
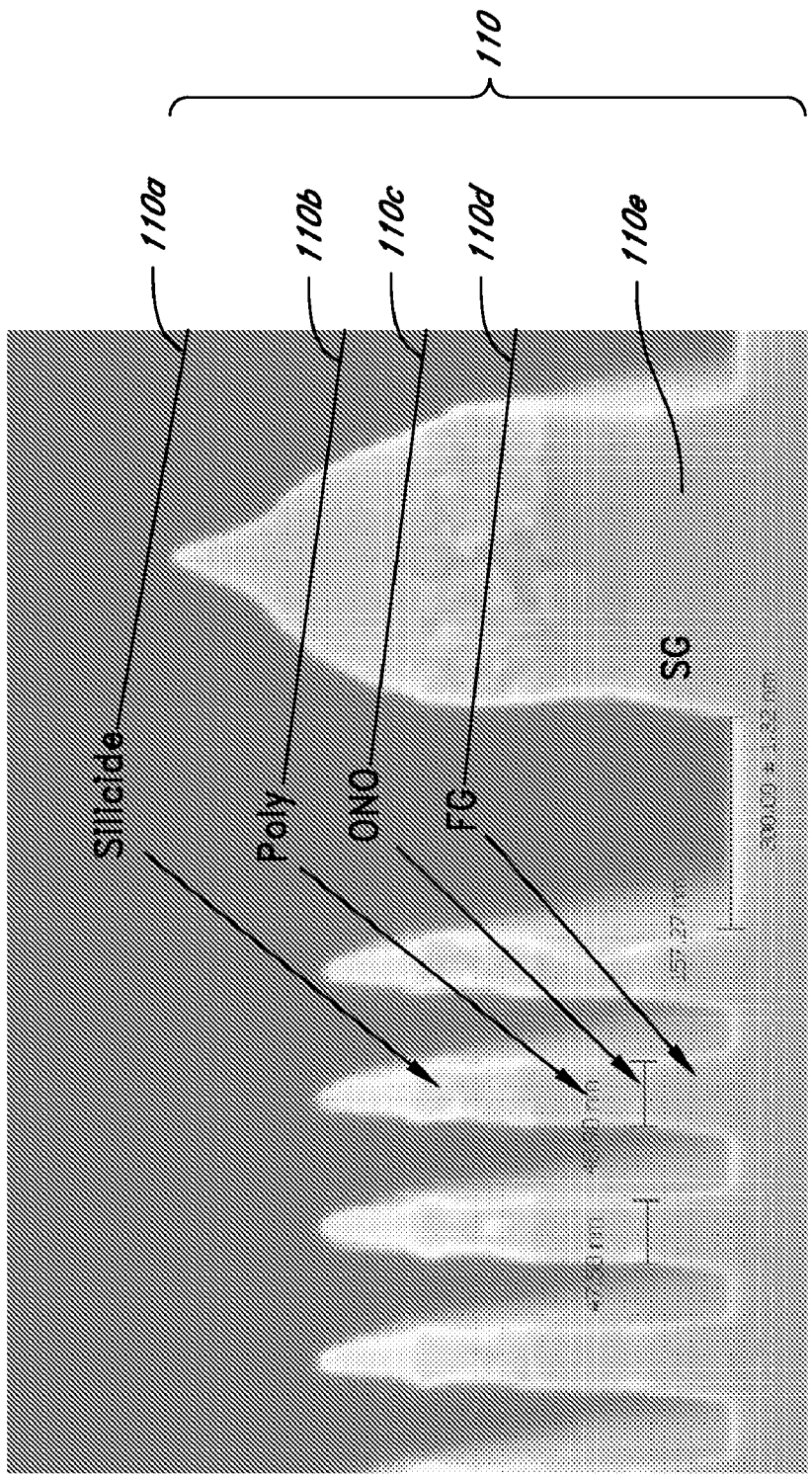
FIG. 20 is a micrograph, as viewed through a scanning electron microscope, of a side cross section of a pattern etched into both the array and the periphery of a partially formed integrated circuit, formed in accordance with preferred embodiments of the invention.

FIG. 20 shows a structure resulting after etching the substrate 110. As noted above, the substrate 110 can be any layer of material or materials that the patterns 177 and 230 are etched into. The composition of the substrate 110 can depend upon, e.g., the electrical device to be formed. Thus, in FIG. 19, the substrate 110 comprises a silicide layer 110a, a polysilicon layer 110b, an oxide-nitride-oxide (ONO) composite layer 110c and a floating gate (FG) polysilicon layer 110d. On the right hand side of the figure, this sequence of layers forms a source select gate (SG) control line 110e. Note that all the illustrated features are located in the array, although the SG control line 110e has a relatively large critical dimension due to being defined using the pattern 230. Such an arrangement of layers can be advantageously used in the formation of, e.g., a control gate stack for NAND flash memory.

Note that the etched surfaces exhibit exceptionally low edge roughness. In addition, the trenches formed in the array show excellent uniformity, even at the low 100 nm pitch (50 nm feature size) pictured. Advantageously, these results are achieved while also forming well-defined and smooth lines in the periphery, which can have a width significantly greater than about 100 nm, e.g., about 250 nm in the illustrated structure.

It will be appreciated that the formation of patterns according to the preferred embodiments offers numerous advantages. For example, the ability to deposit the second and third hard mask layers 150 and 155 at low temperatures of, e.g., less than about 550° C., more preferably, less than about 400° C. maintains the structural and chemical integrity of the amorphous carbon layer 160. Moreover, the third hard mask layer 155 can provide a buffer to protect the amorphous carbon layer 160 from etch chemistries employed for overlying materials. Advantageously, the third hard mask layer 155 allows overlying patterns to be cleaned without undesirably etching the amorphous carbon layer 160. Thus, the definition of the patterns can be improved and unwanted materials, such as polymerized organics, can be effectively removed.

In addition, because multiple patterns, with differently-sized features, can be consolidated on a single final mask layer before being transferred to a substrate, overlapping patterns can easily be transferred to the substrate. Thus, pitch-doubled features and features formed by conventional photolithography can easily be formed connected to each other. Moreover, as evident in FIG. 20, exceptionally small features can be formed, while at the same time achieving exceptionally low line edge roughness. While not limited by theory, it is believed that such low line edge roughness is the result of the use of the layers 140 and 160. Forming the spacers 175 and performing multiple anisotropic etches to transfer the patterns 177 and 230 from the level of the temporary layer 140 to the primary mask layer 160 and then to the substrate 110 are believed to beneficially smooth the surfaces of the features forming the patterns 177 and 230. Moreover, the preferred amorphous carbon etch chemistries disclosed herein allow the use of thin hard mask layers, such as the layers 130, 150, and 155 relative to the depth that underlying amorphous carbon layers, such as the layers 140 and 160, are etched. This advantageously allows the layers 140 and 160 to be more easily and effectively etched. In addition, demands on the identity and etch selectivity for the layers (e.g., the photoresist layers in FIG. 5) overlying the hard mask layers are reduced, since the hard mask layers 130, 150 and 155 do not need to be etched to a great depth.

It will also be appreciated that various modifications of the illustrated process flow are possible. For example, pitch multiplied patterns typically formed closed loops, since the patterns are formed by spacers that formed along the wall of a mandrel. Consequently, where the pitch multiplied pattern is used to form conductive lines, additional processing steps are preferably used to cut off the ends of these loops, so that each loop forms two individual, non-connected lines. This can be accomplished, for example, by forming a protective mask around the parts of the lines to be maintained, while etching away the unprotected ends of the masks. A suitable method for cutting off the ends of the loops is disclosed in U.S. patent application Ser. No. 10/931,771 to Tran et al., filed Aug. 31, 2004, the entire disclosure of which is incorporated be reference herein.

Figure 21A:
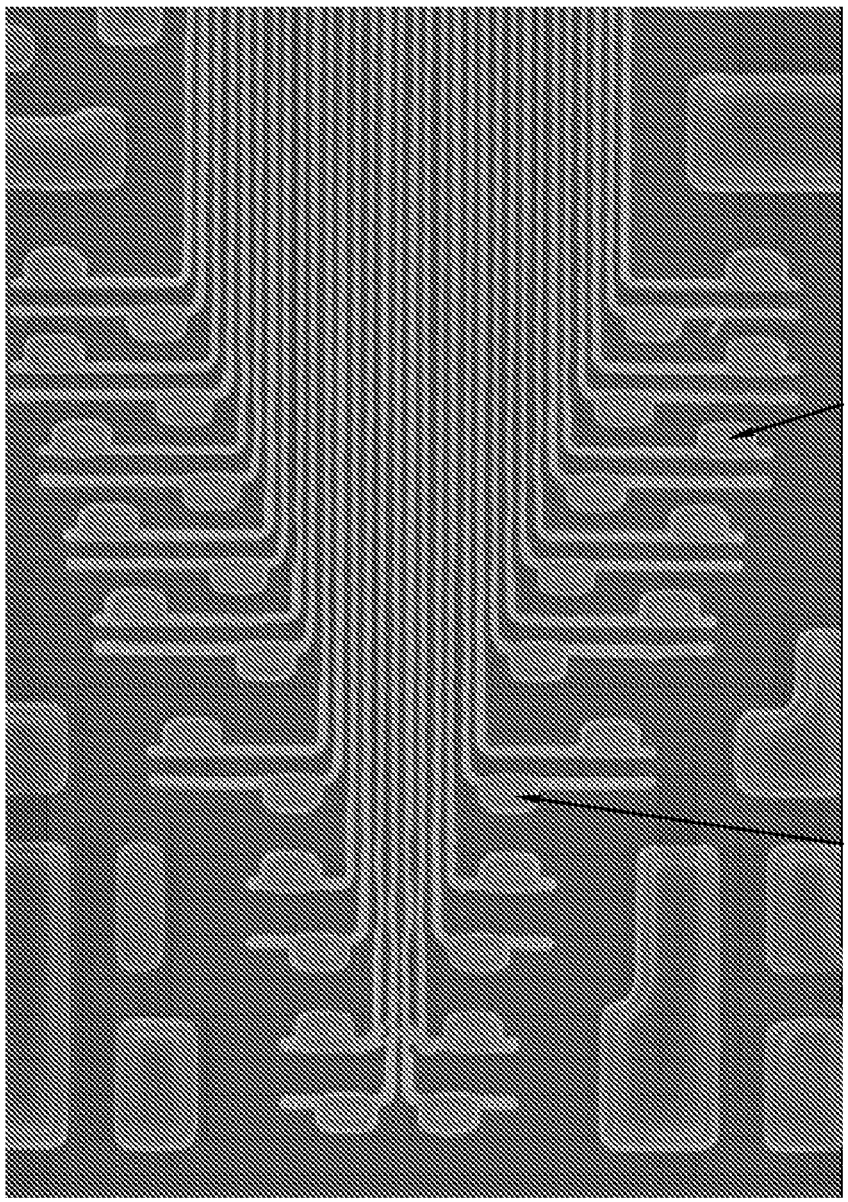
FIGS. 21A and 21B are micrographs, as viewed through a scanning electron microscope, of a top view of a pattern etched into the array and the periphery, respectively, of a partially formed integrated circuit, formed in accordance with preferred embodiments of the invention.
Figure 21B:
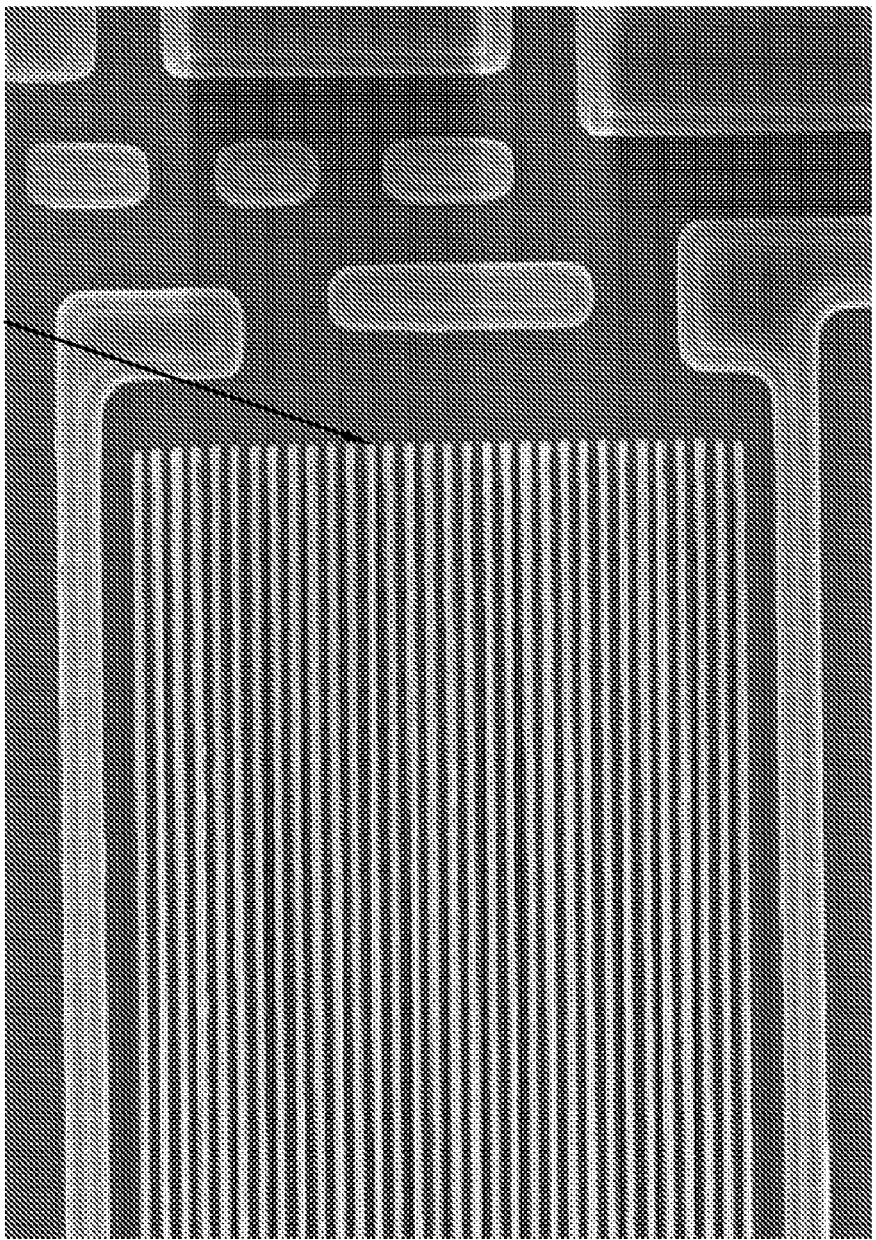

In addition to forming gate control stacks, it will be appreciated that the preferred embodiments can be employed to form interconnect lines and associated integrated circuit features, such as landing pads. FIGS. 21A and 21B show top views of an integrated circuit after the etching way the ends of the loops to form individual conductive interconnects. FIG. 21A shows the ends of the loops formed with landing pads for each interconnect, while FIG. 21B shows the other end of the interconnects. It will be appreciated that the magnifications for each figure is different. Methods for forming interconnects and landing pads are disclosed in U.S. patent application Ser. No. 10/931,771 to Tran et al., filed Aug. 31, 2004, the entire disclosure of which is incorporated herein by reference.

It will also be appreciated that the pitch of the pattern 177 can be more than doubled. For example, the pattern 177 can be further pitch multiplied by forming spacers around the spacers 175, then removing the spacers 175, then forming spacers around the spacers that were formerly around the spacers 175, and so on. An exemplary method for further pitch multiplication is discussed in U.S. Pat. No. 5,328,810 to Lowrey et al. In addition, while the preferred embodiments can advantageously be applied to form patterns having both pitch multiplied and conventionally photolithographically defined features, the patterns 177 and 230 can both be pitch multiplied or can have different degrees of pitch multiplication.

Moreover, more than two patterns 177 and 230 can be consolidated on the primary mask layer 160 if desired. In such cases, additional mask layers can be deposited between the layers 140 and 160. For example, the patterns 177 and 230 can be transferred to an additional mask layer overlying the hard mask layer 150 and then the sequence of steps illustrated in FIGS. 11-16 can be performed to protect the patterns 177 and 230, to form a new pattern in an overlying photodefinable layer, and to transfer the patterns to the substrate 110. The additional mask layer preferably comprises a material that can be selectively etched relative to the hard mask layer 150 and a protective layer that surrounds the patterns 177 and 230 after being transferred to the additional mask layer.

In addition, the preferred embodiments can be employed multiple times throughout an integrated circuit fabrication process to form pitch multiplied features in a plurality of layers or vertical levels, which may be vertically contiguous or non-contiguous and vertically separated. In such cases, each of the individual levels to be patterned would constitute a substrate 110 and the various layers 120-220 can formed over the individual level to be patterned. It will also be appreciated that the particular composition and height of the various layers 120-220 discussed above can be varied depending upon a particular application. For example, the thickness of the layer 160 can be varied depending upon the identity of the substrate 110, e.g., the chemical composition of the substrate, whether the substrate comprises single or multiple layers of material, the depth of features to be formed, etc., and the available etch chemistries. In some cases, one or more layers of the layer 120-220 can be omitted or more layers can be added. For example, the layer 160 can be omitted in cases where the hard mask layers 150 and/or 155 are sufficient to adequately transfer a pattern to the substrate 110.

Also, while "processing" through the various mask layers preferably involves etching an underlying layer, processing through the mask layers can involve subjecting layers underlying the mask layers to any semiconductor fabrication process. For example, processing can involve ion implantation, diffusion doping, depositing, or wet etching, etc. through the mask layers and onto underlying layers. In addition, the mask layers can be used as a stop or barrier for chemical mechanical polishing (CMP) or CMP can be performed on any of the layers to allow for both planarization and etching of the underlying layers, as discussed in U.S. Provisional Patent Application No. 60/666,031, filed Mar. 28, 2005, the entire disclosure of which is incorporated by reference herein.

Accordingly, it will be appreciated by those skilled in the art that various other omissions, additions and modifications may be made to the methods and structures described above without departing from the scope of the invention. All such modifications and changes are intended to fall within the scope of the invention, as defined by the appended claims.

We claim:

1. A method for processing a semiconductor substrate having a primary mask layer overlying the substrate, a hard mask layer formed of a first material overlying the primary mask layer, a hard mask layer formed of a second material overlying the hard mask layer formed of the first material, and a pattern of pitch-multiplied spacers overlying the hard mask layer comprising the second material, the method comprising:

transferring the pattern to the hard mask layer comprising the second material to expose parts of the first material;

transferring the pattern to the hard mask layer formed of the first material, the exposed parts of the first material remaining exposed between transferring the pattern to the hard mask layer comprising the second material and transferring the pattern to the hard mask layer formed of the first material; and subsequently transferring the pattern to the primary mask layer.

2. The method of claim 1, wherein the spacers extend in spaced, generally parallel relation to one another at least between first and second spaced planes extending perpendicular to the spacers.

3. The method of claim 1, further comprising perform a carbon strip before transferring the pattern to the hard mask layer comprising the second material.

4. The method of claim 1, wherein the primary mask layer comprises amorphous carbon.

5. The method of claim 4, wherein the primary mask layer comprises transparent carbon.

6. The method of claim 4, wherein the spacers are formed of the first material.

7. The method of claim 4, wherein the first material is silicon or silicon oxide.

8. The method of claim 7, wherein transferring the pattern to the hard mask layer comprising the second material comprises etching the hard mask layer using a HBr and $Cl_2$ containing plasma.

9. The method of claim 7, wherein the second material is different from the first material and is silicon or silicon oxide.

10. The method of claim 9, wherein transferring the pattern to the hard mask layer comprising the second material comprises etching the hard mask layer comprising the second material using a fluorocarbon plasma.

11. The method of claim 1, further comprising transferring the pattern to the substrate.

12. A method for creating sublithographic features during semiconductor fabrication, comprising:

forming free-standing pitch-multiplied spacers over a hard mask material, the free-standing spacers forming a pattern;

subsequently subjecting the free-standing spacers to a pattern cleaning etch; and subsequently transferring the pattern formed by the free-standing spacers into the hard mask material.

13. The method of claim 12, wherein forming free-standing pitch multiplied spacers comprises:

patterning a temporary layer to form a plurality of mandrels;

blanket depositing spacer material over the mandrels;

selectively removing spacer material from horizontal surfaces to form spacers on sidewalls of the mandrels; and selectively removing the mandrels to leave the spacers free-standing.

14. The method of claim 13, wherein patterning the temporary layer comprises:

patterning a photoresist layer overlying the temporary layer; and transferring a pattern in the photoresist layer to the temporary layer.

15. The method of claim 13, wherein the temporary layer comprises a carbon material.

16. The method of claim 13, wherein the carbon material is amorphous carbon.

17. The method of claim 12, wherein subsequently subjecting the free-standing spacers to the pattern cleaning etch comprises performing an organic strip etch.

18. The method of claim 17, wherein performing the organic strip etch comprises performing an $O_2$ plasma etch.

19. The method of claim 12, further comprising defining another pattern in a photoresist layer over the substrate using photolithography without pitch multiplication, wherein defining the other pattern is performed after forming free-standing pitch-multiplied spacers and before subsequently subjecting the free-standing spacers to the pattern cleaning etch.

20. The method of claim 19, wherein the other pattern is formed directly overlying a periphery region of the substrate and the pattern is formed directly overlying the array region of the substrate.

21. The method of claim 19, wherein the other pattern is formed on a level above the free-standing pitch-multiplied spacers.

22. The method of claim 21, further comprising transferring the other pattern to a same level as the free-standing pitch-multiplied spacers before subsequently subjecting the free-standing spacers to the pattern cleaning etch.

23. A method for semiconductor fabrication, comprising:

forming a first spacer on a vertical side wall of a patterned pillar;

removing the patterned pillar;

forming a second spacer on a vertical side wall of the first spacer;

removing the first spacer;

subsequently subjecting the second spacer to an organic strip etch; and transferring a pattern at least partially defined by the second spacer to a first hard mask material.

24. The method of claim 23, further comprising subsequently transferring the pattern to a second hard mask material.

25. The method of claim 24, further comprising subsequently transferring the pattern to an amorphous carbon layer.

26. The method of claim 24, further comprising subsequently transferring the pattern to a substrate.

27. The method of claim 26, wherein transferring the pattern to the substrate at least partially defines conductive interconnects in a partially fabricated integrated circuit.

28. The method of claim 26, wherein transferring the pattern to the substrate at least partially defines gate stacks in a partially fabricated integrated circuit.

* * * * *